(12) United States Patent
Lee et al.

(10) Patent No.: US 10,811,437 B2
(45) Date of Patent: Oct. 20, 2020

(54) DISPLAY DEVICE INCLUDING PIXEL ELECTRODE HAVING MULTIPLE DOMAINS

(71) Applicant: Samsung Display Co., Ltd., Yongin-si (KR)

(72) Inventors: Se Hyun Lee, Hwaseong-si (KR); Hak Sun Chang, Yongin-si (KR); Byoung Sun Na, Seoul (KR); Seung Min Lee, Seoul (KR)

(73) Assignee: Samsung Display Co., Ltd., Yongin-si (CN)

( * ) Notice: Subject to any disclaimer, the term of this patent is extended or adjusted under 35 U.S.C. 154(b) by 0 days.

(21) Appl. No.: 16/136,255

(22) Filed: Sep. 20, 2018

(65) Prior Publication Data

US 2019/0296048 A1    Sep. 26, 2019

(30) Foreign Application Priority Data

Mar. 22, 2018 (KR) ........................ 10-2018-0033403

(51) Int. Cl.
*H01L 27/12* (2006.01)
*G02F 1/1368* (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC ............ H01L 27/124; H01L 29/78669; G02F 1/13439; G02F 1/136286; G02F 1/134309;
(Continued)

(56) References Cited

U.S. PATENT DOCUMENTS 9,500,917 B2   11/2016  Ryu et al.
2006/0146243 A1  7/2006  Nakanishi et al.
(Continued)

FOREIGN PATENT DOCUMENTS

JP          4829501      12/2011
KR     10-2010-0025367    3/2010
(Continued)

*Primary Examiner* — Laura M Menz
*Assistant Examiner* — Candice Chan
(74) *Attorney, Agent, or Firm* — H.C. Park & Associates

(57) ABSTRACT

A display device including a gate line, first and second data lines adjacent to each other in a first direction and crossing the gate line, a first transistor electrically connected to the gate line and the first data line, and a first pixel electrode electrically connected to the first transistor, in which the first pixel electrode includes a first sub-electrode and a second sub-electrode adjacent to each other in the first direction, the first sub-electrode includes a first longitudinal stem extending in a direction substantially parallel to the first data line and overlapping the first data line and a plurality of first branches connected to the first longitudinal stem, and the second sub-electrode includes a second longitudinal stem extending in a direction substantially parallel to the second data line and overlapping the second data line and a plurality of second branches connected to the second longitudinal stem.

15 Claims, 16 Drawing Sheets

(51) Int. Cl.
*G02F 1/1362* (2006.01)
*G02F 1/1343* (2006.01)
*G02F 1/1335* (2006.01)
*H01L 29/786* (2006.01)

(52) U.S. Cl.
CPC .. *G02F 1/134309* (2013.01); *G02F 1/136213* (2013.01); *G02F 1/136286* (2013.01); *G02F 1/133514* (2013.01); *G02F 1/136209* (2013.01); *G02F 2001/134345* (2013.01); *G02F 2001/136218* (2013.01); *G02F 2001/136295* (2013.01); *G02F 2202/103* (2013.01); *H01L 29/78669* (2013.01)

(58) Field of Classification Search
CPC ............. G02F 1/136213; G02F 1/1368; G02F 2001/134345; G02F 1/133514; G02F 2001/136295; G02F 2202/103; G02F 1/136209; G02F 2001/136218; G02F 1/134336; G02F 1/133707; G02F 1/1343
See application file for complete search history.

(56) References Cited

U.S. PATENT DOCUMENTS

| | | |
|---|---|---|
| 2010/0053528 A1 | 3/2010 | Li et al. |
| 2013/0194536 A1* | 8/2013 | Tae .................. G02F 1/133707 349/143 |
| 2016/0097953 A1 | 4/2016 | Chang et al. |
| 2016/0209714 A1* | 7/2016 | Yun .................. G02F 1/133512 |
| 2017/0153517 A1 | 6/2017 | Shin et al. |
| 2017/0192284 A1 | 7/2017 | Yoon et al. |
| 2017/0242306 A1 | 8/2017 | Chang et al. |
| 2018/0107040 A1* | 4/2018 | Yeh .................. G02F 1/13439 |

FOREIGN PATENT DOCUMENTS

| | | |
|---|---|---|
| KR | 10-2017-0062562 | 6/2017 |
| KR | 10-2017-0082688 | 7/2017 |
| KR | 10-2017-0099425 | 9/2017 |

* cited by examiner

DISPLAY DEVICE INCLUDING PIXEL ELECTRODE HAVING MULTIPLE DOMAINS

CROSS-REFERENCE TO RELATED APPLICATION

This application claims priority from and the benefit of Korean Patent Application No. 10-2018-0033403, filed on Mar. 22, 2018, which is hereby incorporated by reference for all purposes as if fully set forth herein.

BACKGROUND

Field

Exemplary embodiments of the invention relate generally to a display device, and more particularly, to a display device with improved transmittance and visibility.

Discussion of the Background

A display device includes a display panel having a plurality of pixels therein capable of displaying an image. Each pixel includes a pixel electrode connected to at least one transistor to receive a data signal.

Among various display devices, a liquid crystal display includes field generating electrodes including the pixel electrode and a common electrode, and a liquid crystal layer therebetween. A liquid crystal display may generally apply a voltage to the field generating electrode to generate an electric field to the liquid crystal layer, such that a direction of liquid crystal molecules of the liquid crystal layer may be determined to display a desired image by controlling polarization of incident light.

The above information disclosed in this Background section is only for understanding of the background of the inventive concepts, and, therefore, it may contain information that does not constitute prior art.

SUMMARY

Display devices constructed according to exemplary embodiments of the invention provide improved transmittance and visibility.

Additional features of the inventive concepts will be set forth in the description which follows, and in part will be apparent from the description, or may be learned by practice of the inventive concepts.

A display device according to an exemplary embodiment includes a gate line, a first data line and a second data line adjacent to each other in a first direction and crossing the gate line, a first transistor electrically connected to the gate line and the first data line, and a first pixel electrode electrically connected to the first transistor, in which the first pixel electrode includes a first sub-electrode and a second sub-electrode adjacent to each other in the first direction, the first sub-electrode includes a first longitudinal stem extending in a direction substantially parallel to the first data line and overlapping the first data line and a plurality of first branches connected to the first longitudinal stem, and the second sub-electrode includes a second longitudinal stem extending in a direction substantially parallel to the second data line and overlapping the second data line and a plurality of second branches connected to the second longitudinal stem.

The first sub-electrode may include a first portion and a second portion disposed at opposing sides of the first longitudinal stem, respectively, and a width of the first portion positioned at a first side of the first longitudinal stem in the first direction may be different from a width of the second portion positioned at a second side of the first longitudinal stem in the first direction.

The first portion may be closer to an edge of the first pixel electrode than the second portion, and the width of the first portion in the first direction may be less than the width of the second portion in the first direction.

A first gap extending in a second direction crossing the first direction may be formed between the first sub-electrode and the second sub-electrode, and a width of the first gap in the first direction may be gradually changed along the second direction.

The display device may further include a second pixel electrode adjacent to the first pixel electrode in the first direction, and a second gap extending in the second direction may be formed between the first pixel electrode and the second pixel electrode, in which a width of the second gap in the first direction may be gradually changed along the second direction.

A width of at least a part of the first longitudinal stem in the first direction may be gradually changed along the second direction, and a direction in which the width of the first longitudinal stem in the first direction increases may be opposite to a direction in which the width of the first gap in the first direction increases.

The first sub-electrode may include a first region where the first branches have a first pitch, and a second region where the first branches have a second pitch less than the first pitch.

A center of the first longitudinal stem may be positioned at the first region.

The first sub-electrode further may include a first transverse stem connected to the first longitudinal stem, and a boundary between the first region and the second region may cross a portion of the first longitudinal stem positioned at one side of the first transverse stem.

A first gap extending in a second direction crossing the first direction may be formed between the first sub-electrode and the second sub-electrode, and a width of the first gap in the first direction may be gradually changed along the second direction.

A width of at least a part of the first longitudinal stem in the first direction may be gradually changed along the second direction, and a direction in which the width in the first direction of the first longitudinal stem increases may be opposite to a direction in which the width of the first gap in the first direction increases.

The first sub-electrode may include a first region where the first branches have a first pitch, and a second region where the first branches have a second pitch less than the first pitch.

A gap extending in a second direction crossing the first direction may be formed between the first sub-electrode and the second sub-electrode, and the first pixel electrode may further include a connector connecting the first sub-electrode and the second sub-electrode.

The display device may further include a second pixel electrode adjacent to the first pixel electrode in a second direction crossing the first direction, and a second transistor electrically connected to the second pixel electrode, in which the gate line may include a first sub-gate line and a second sub-gate line substantially parallel to each other, the first transistor may be electrically connected to the first sub-gate line, and the second transistor may be electrically connected to the second sub-gate line and the second data line.

The first data line and the second data line may extend substantially in the second direction while crossing the first pixel electrode and the second pixel electrode.

A first gap extending in the second direction may be formed between the first sub-electrode and the second sub-electrode, and the first gap may be disposed between the first data line and the second data line.

A display device according to an exemplary embodiment includes a gate line, a first data line and a second data line adjacent to each other in a first direction and crossing the gate line, and a first pixel electrode, in which the first pixel electrode includes a switching element electrically connected to the gate line and the first data line, a first sub-electrode electrically connected to the switching element, and a second sub-electrode connected to the first sub-electrode, the first sub-electrode and the second sub-electrode include a plurality of branches, respectively, the first sub-electrode and the second sub-electrode include two sub-regions in which extending directions of the branches are different from each other, respectively, the first data line extends along a boundary between the two sub-regions included in the first sub-electrode, and the second data line extends along a boundary between the two sub-regions included in the second sub-electrode.

The first sub-electrode may include a first portion and a second portion respectively disposed at the two sub-regions, and a width of the first portion in the first direction may be different from a width of the second portion in the first direction.

The first portion may be closer to an outer edge of the first pixel electrode than the second portion, and the width of the first portion in the first direction may be less than the width of the second portion in the first direction.

A first gap extending in a second direction crossing the first direction may be formed between the first sub-electrode and the second sub-electrode, and a width in the first direction of the first gap may be gradually changed along the second direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
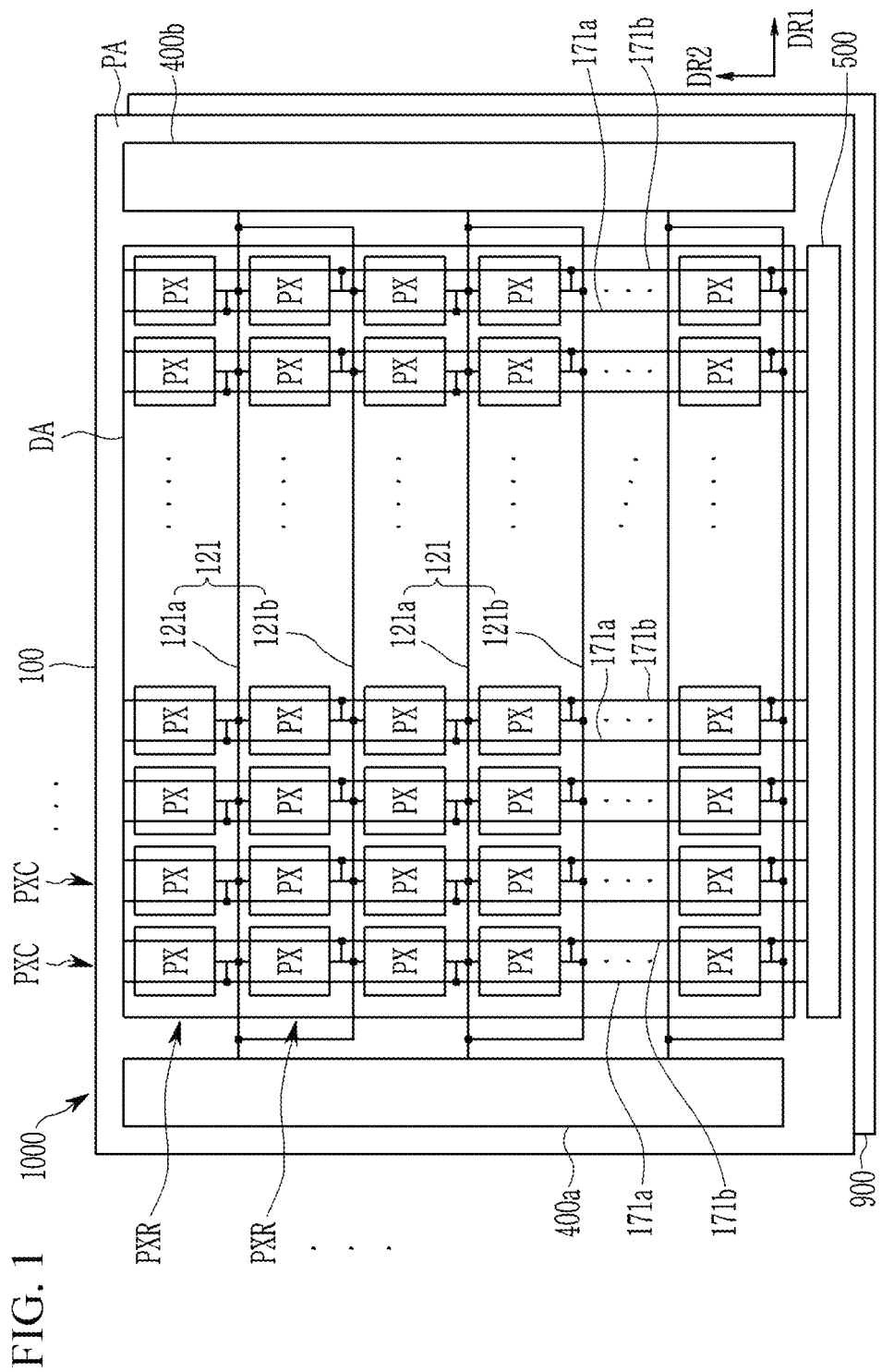
FIG. 1 is a schematic layout view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, a plan view may refer to a view when observing a surface in parallel with two directions (e.g., a first direction DR1 and a second direction DR2) crossing each other, and a cross-sectional view may refer to a view when observing a surface cut in a direction (e.g., a third direction) perpendicular to the surface parallel to the first direction DR1 and the second direction DR2. Also, overlapping two constituent elements may refer to two constituent elements overlapping in the third direction (e.g., a direction perpendicular to an upper surface of the substrate), unless stated otherwise.

A structure of a display device according to an exemplary embodiment is described with reference to FIG. 1.

Referring to FIG. 1, a display device 1000 according to an exemplary embodiment includes a display panel 100 including a display area DA and a peripheral area PA positioned outside the display area DA. The display device 1000 may further include a backlight 900 providing light to the display panel 100.

The display area DA may be capable of displaying an image according to on an input image, and may include a plurality of pixels PX, a plurality of gate lines 121, and a plurality of data lines 171a and 171b.

Each pixel PX may be repeatedly arranged, as a base unit, to display the image, and may include a portion emitting light and a portion blocking light. The plurality of pixels PX may be arranged in an approximate matrix type. In a plan view, a unit region enclosed by a boundary between the adjacent pixels PX may be referred to as "a pixel area." The pixel area includes a transmitting region where light from the backlight 900 is transmitted, and a light blocking region where the light is not transmitted. This light blocking region may be included in the light blocking part having a lattice shape, which will be described in more detail below.

Each pixel PX may include at least one switching element electrically connected the gate line 121 and the data lines 171a and 171b, and at least one pixel electrode connected thereto. The switching element may include a gate terminal, an input terminal, and an output terminal, as an electrical element, such as a thin film transistor integrated in the display panel 100. The switching element is turned on or turned off depending on a gate signal of the gate line 121, thereby selectively transmitting a data voltage from the data lines 171a and 171b to a pixel electrode. The pixels PX may display the corresponding image depending on the data voltage applied to the pixel electrode.

To display various colors, each pixel PX may display one of primary colors, and the image of a desired color may be recognized by a spatial and temporal combination of the primary colors. For example, the primary colors may be three primary colors, such as red, green, and blue, or white may be further included.

The pixels PX in each pixel column PXC may represent the same primary colors as each other, and the pixels PX of adjacent pixel columns PXC may represent different primary colors from each other. As another example, the pixels PX in each pixel row PXR may represent the same primary colors as each other, and the pixels PX of adjacent pixel rows PXR may represent different primary colors from each other. As another example, four pixels PX adjacent to each other within a quadrangle shape may represent two or more different primary colors from each other. For example, four pixels PX adjacent to each other within the quadrangle shape may respectively represent red, green, blue, and white.

The gate line 121 may transmit the gate signal, such as a gate-on voltage and a gate-off voltage, etc. The plurality of gate lines 121 may be sequentially arranged in a direction parallel to the second direction DR2 crossing the first direction DR1. As used herein, the direction parallel to the first direction DR1/the second direction DR2/the third direction DR3 may refer to the first direction DR1/second direction DR2/third direction DR3 illustrated in the corresponding figures or a direction opposite thereto.

One gate line 121 transmitting one gate signal may include first and second sub-gate lines 121a and 121b electrically connected to each other. Each of the sub-gate lines 121a and 121b may extend in a direction substantially parallel to the first direction DR1, and the first and second sub-gate lines 121a and 121b may be substantially parallel to each other in the display area DA. The first sub-gate line 121a and the second sub-gate line 121b are arranged in a direction substantially parallel to the second direction DR2. The first and second sub-gate lines 121a and 121b included in one gate line 121 are respectively positioned in different pixel rows PXR from each other, and may be electrically connected to the switching element of the pixels PX of each pixel row PXR corresponding thereto. The first and second sub-gate lines 121a and 121b included in one gate line 121 may be physically and electrically connected to each other near left/right edges of the display area DA or at the peripheral area PA, thereby transmitting the same gate signal.

The data lines 171a and 171b may transmit the data voltage corresponding to the image signal input to the display device. The plurality of data lines 171a and 171b may be arranged in a direction substantially parallel to the first direction DR1, and each of the data lines 171a and 171b may extend in a direction substantially parallel to the second direction DR2.

Each pixel column PXC may be disposed corresponding to a pair of data lines 171a and 171b. The data lines 171a and 171b may be alternately arranged in the direction parallel to the first direction DR1. A pair of data lines 171a and 171b corresponding to one pixel column PXC may overlap the pixel area while crossing the inside of the pixel area of the pixels PX of the corresponding pixel column PXC. More particularly, the data lines 171a and 171b may pass through the inside of one transmission region defined in each of the pixels PX of the corresponding pixel column PXC. A pair of data lines 171a and 171b corresponding to one pixel column PXC may transmit different data voltage from each other.

A pair of data lines 171a and 171b corresponding to one pixel column PXC are electrically connected to the switching element of the pixels PX positioned at the corresponding pixel column PXC. More particularly, in one pixel column PXC, the switching elements of two pixels PX including the switching elements electrically connected to the first and second sub-gate lines 121a and 121b of one gate line 121 are electrically connected to the different data lines 171a and 171b of a pair of data lines 171a and 171b. Accordingly, in one pixel column PXC, the adjacent pixels PX connected to one gate line 121 may respectively receive the corresponding data voltages through the data lines 171a and 171b that are different from each other at the same time. For example, as shown in FIG. 1, in each pixel column PXC, the switching elements of the pixels PX arranged in the direction parallel to the second direction DR2 are alternately electrically connected to a pair of corresponding data lines 171a and 171b.

As described above, in the display panel 100 according to an exemplary embodiment including the pixels PX disposed in a matrix shape, the number of data lines 171a and 171b may be about twice the number of the entire pixel columns PXC, while the number of gate lines 121 may be approximately about half of the number of the total pixel rows PXR.

Most of the peripheral area PA may not transmit light, so a light blocking member may be positioned on the peripheral area PA. Also, most of the peripheral area PA may be a region where the image is not displayed. As such, gate drivers 400a and 400b and a plurality of signal lines (not shown) transmitting driving control signals to the gate drivers 400a and 400b may be disposed in the peripheral area PA.

The gate drivers 400a and 400b may be connected to the gate lines 121, and may transmit the gate signal to the gate lines 121 depending on control of a timing controller. The gate drivers 400a and 400b may include a first gate driver 400a and a second gate driver 400b positioned at respective sides of the display area DA. Each of the gate drivers 400a and 400b may include a plurality of stages sequentially arranged in the direction approximately parallel to the second direction DR2, and each stage may be connected to each gate line 121, thereby respectively transmitting the gate signal. According to an exemplary embodiment, one of the two gate drivers 400a and 400b may be omitted. The gate drivers 400a and 400b may be directly formed at the peripheral area PA of the display panel 100 through the same process of forming an electrical element, such as a thin film transistor of the display area DA.

A data driver 500 is connected to the data lines 171a and 171b. The data driver 500 may apply the data voltage corresponding to the input image signal as a gray voltage to the data lines 171a and 171b depending on the control of the timing controller. The data driver 500 may be mounted on the peripheral area PA of the display panel 100 as a type of a plurality of driving chips, or may be mounted on a flexible printed circuit film or a printed circuit board (PCB) electrically connected to the display panel 100.

The backlight 900 may be positioned at the rear surface of the display panel 100 to provide light to the display panel 100, and may include a plurality of light-emitting elements arranged in a plane or linear manner, and various optical films.

The detailed structure of a display device according to an exemplary embodiment will now described with reference to FIG. 2 to FIG. 7 together with FIG. 1.

The display panel of a display device 1000a according to an exemplary embodiment includes a first substrate 110 and a second substrate 210, and a liquid crystal layer 3 positioned between the first and second substrates 110 and 210. As used herein, "upper" with regards to the first substrate 110 may refer to an upper side of the surface toward the liquid crystal layer 3 among two surfaces of the first substrate 110, and "lower" with regards to the second substrate 210 may refer to a lower side of the surface toward the liquid crystal layer 3 among two surfaces of the second substrate 210.

A gate conductive layer including a gate line 121, a gate electrode 124, and a storage electrode line 131 may be disposed on the first substrate 110. The gate conductive layer may include at least one metal, such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), alloys thereof, etc.

A plurality of gate electrodes 124 may be directly connected to one gate line 121. The gate electrode 124 may be connected to the gate line 121, and may have a shape protruding upward from the gate line 121. The gate line 121 extends in a direction substantially parallel to the first direction DR1. A hole 24 may be formed inside the gate electrode 124 as an opening.

The storage electrode line 131 is separated from the gate line 121 and the gate electrode 124 in a plan view, and may transmit a predetermined voltage, such as a common voltage. The storage electrode line 131 may include one main line 131a mainly extending in a direction substantially parallel to the first direction DR1, a plurality of extensions 131b connected to the main line 131a mainly expanding in a direction substantially parallel to the second direction DR2, and a plurality of expanded parts 131c that expand from the main line 131a. A pitch of the plurality of extensions 131b connected to the main line 131a in the first direction DR1 and a pitch of the plurality of expanded parts 131c in the first direction DR1 may substantially be the same as the pitch of the plurality of pixels PX in the first direction DR1.

A gate insulating layer 140 may be disposed on the gate conductive layer. A semiconductor layer including a plurality of semiconductors 153 and 156 is disposed on the gate insulating layer 140. The semiconductor layer may include an amorphous, polysilicon, or oxide semiconductor material. The semiconductor 153 and the gate electrode 124 may overlap each other on a plane.

Ohmic contacts 163 and 165 may be disposed on the semiconductor 153. When the semiconductor layer includes silicon, the ohmic contacts 163 and 165 may include n+ hydrogenated amorphous silicon, to which an n-type impurity, such as phosphorus, is doped at high concentration, or a silicide. According to an exemplary embodiment, the ohmic contacts 163 and 165 may be omitted.

A data conductive layer including the data lines 171a and 171b, a source electrode 173, and a drain electrode 175 may be disposed on the ohmic contacts 163 and 165 and the gate insulating layer 140. The data conductive layer may include at least one metal, such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys thereof.

The data lines 171a and 171b mainly extend in a direction substantially parallel to the second direction DR2 and cross the gate line 121. The data lines 171a and 171b may include a curved part CV, which may include a portion extending substantially parallel to the first direction DR1 and a portion extending substantially parallel to the second direction DR2. The plurality of source electrodes 173 may be directly connected to one of the data lines 171a and 171b. The source electrode 173 may extend toward the gate electrode 124 from one of the data lines 171a and 171b, and may be curved to have a substantially "C" shape or a horizontally inverted "C" shape, but the shape thereof is not limited thereto.

The hole 24 of the gate electrode 124 overlaps the data lines 171a and 171b on a plane, thereby reducing a signal delay due to coupling between the gate line 121 and the data lines 171a and 171b.

Each of the semiconductors 156 is disposed between the portions where the gate line 121, the gate electrode 124, or the storage electrode line 131 and the data lines 171a and 171b are crossed, thereby preventing an electrical short between the gate conductive layer and the data conductive layer.

The drain electrode 175 is separated from the data lines 171a and 171b and the source electrode 173. The drain electrode 175 may include a portion facing the source electrode 173 at the region overlapping the gate electrode 124 and an expanded part 177. The expanded part 177 may be disposed above the gate line 121 and the gate electrode 124 in a plan view. Most of the region between the drain electrode 175 and the source electrode 173 facing each other may overlap the semiconductor 153.

In a plan view, the expanded part 177 may overlap the expanded part 131c of the storage electrode line 131. The expanded part 177 overlaps the expanded part 131c of the storage electrode line 131 via the gate insulating layer 140, thereby forming a storage capacitor Cst. The storage capacitor Cst may maintain the voltage applied to the drain electrode 175 and the pixel electrode connected thereto even when the data voltage is not applied to the data lines 171a and 171b.

The gate electrode 124, the source electrode 173, and the drain electrode 175 form a thin film transistor Q as the switching element along with the semiconductor 153, and a channel of the thin film transistor Q is formed on the semiconductor 153 between the source electrode 173 and the drain electrode 175.

The ohmic contacts 163 and 165 may be formed only between the underlying semiconductor 153 and the overlying data conductive layer thereof to reduce contact resistance therebetween. The semiconductor 153 may include a portion that is not covered by the data conductive layer and being disposed between the source electrode 173 and the drain electrode 175.

A first insulating layer (hereinafter, referred to as "a passivation layer") 180a including an inorganic insulating material, such as a silicon oxide ($SiO_x$), a silicon nitride ($SiN_x$), and/or an organic insulating material is disposed on the data conductive layer, and a second insulating layer 180b is disposed on the first insulating layer 180a. For example, the first insulating layer 180a may include the inorganic insulating material and the second insulating layer 180b may include the organic insulating material. The first insulating layer 180a and the second insulating layer 180b are disposed on the expanded part 177 of the drain electrode 175, and include a contact hole 185 overlapping the expanded part 177.

In a cross-sectional view, a color filter layer 230 may be disposed between the first insulating layer 180a and the second insulating layer 180b. The color filter layer 230 may include a plurality of color filters representing colors that are different from each other, and each color filter may include a pigment that represents the color represented by the corresponding pixel PX. The second insulating layer 180b may prevent the material of the color filter layer 230 from infiltrating into the liquid crystal layer 3. The color filter layer 230 may include an opening 235 overlapping the contact hole 185 of the first and second insulating layers 180a and 180b. The contact hole 185 may be formed in the opening 235.

In a plan view, two adjacent color filters may be partially overlapped on the boundary between the pixels PX. More particularly, when each color filter extends along each pixel column PXC such that one color filter is disposed on one pixel column PXC, two color filters may be partially overlapped with each other via the adjacent pixel columns PXC, and the region where two color filters are overlapped may overlap the extension 131b of the storage electrode line 131.

A pixel electrode layer including a pixel electrode 191 and a shielding electrode 199 may be disposed on the second insulating layer 180b. The pixel electrode layer may include a transparent conductive material, such as ITO (indium tin oxide) and IZO (indium zinc oxide), or a metal, such as aluminum, silver, chromium, or alloys thereof.

Figure 2:
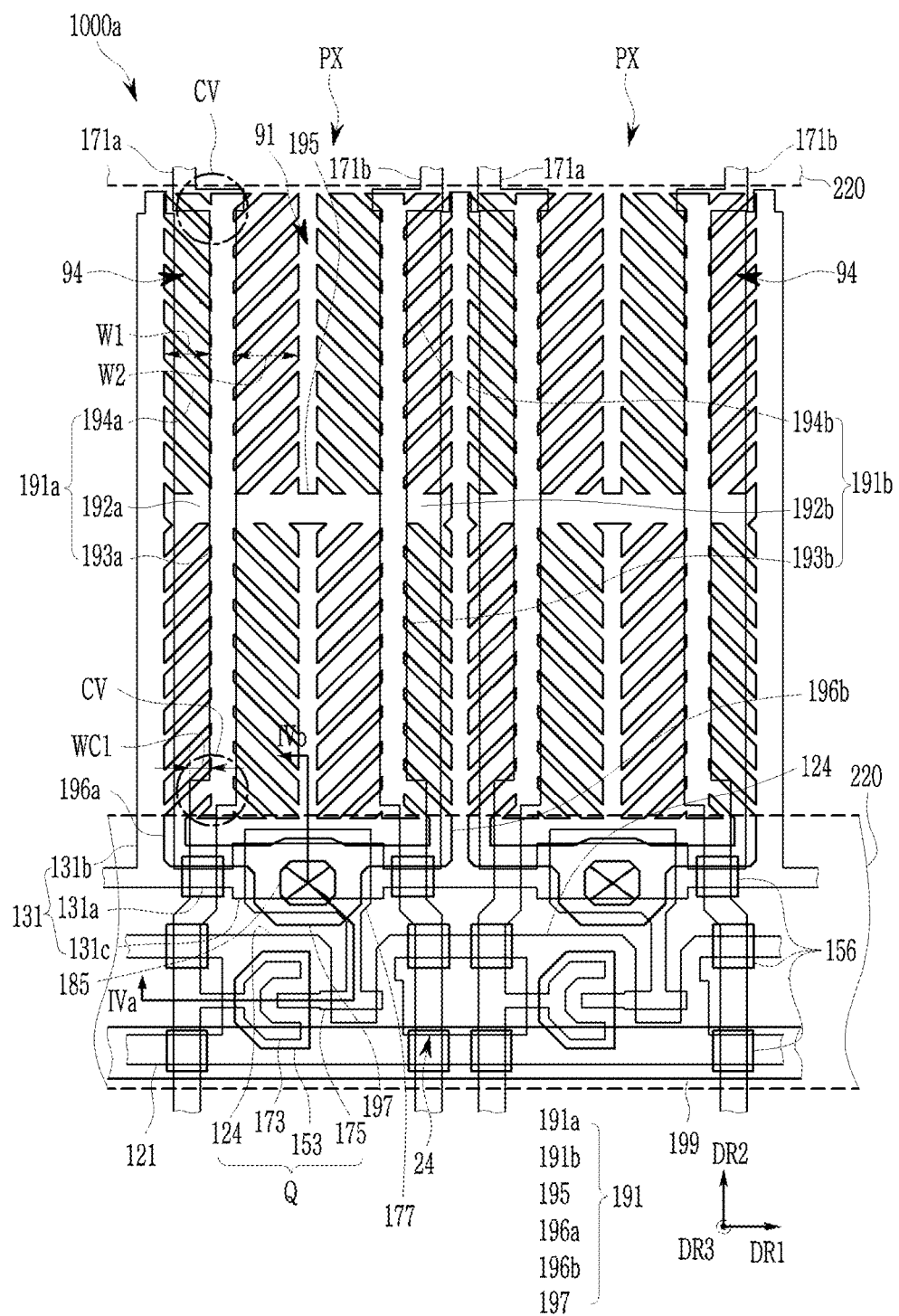
FIG. 2 is a plan layout view of two pixels of a display device according to an exemplary embodiment.
Figure 3:
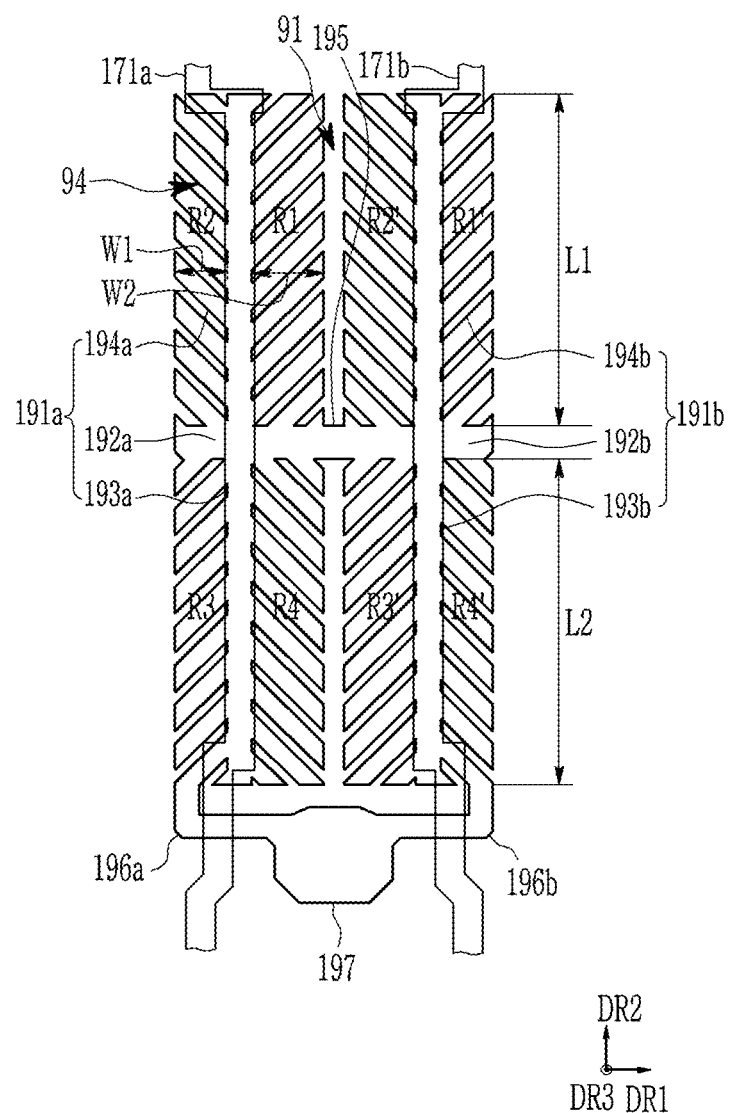
FIG. 3 is a top plan view of pixel electrodes and data lines of a display device shown in FIG. 2.
Figure 4:
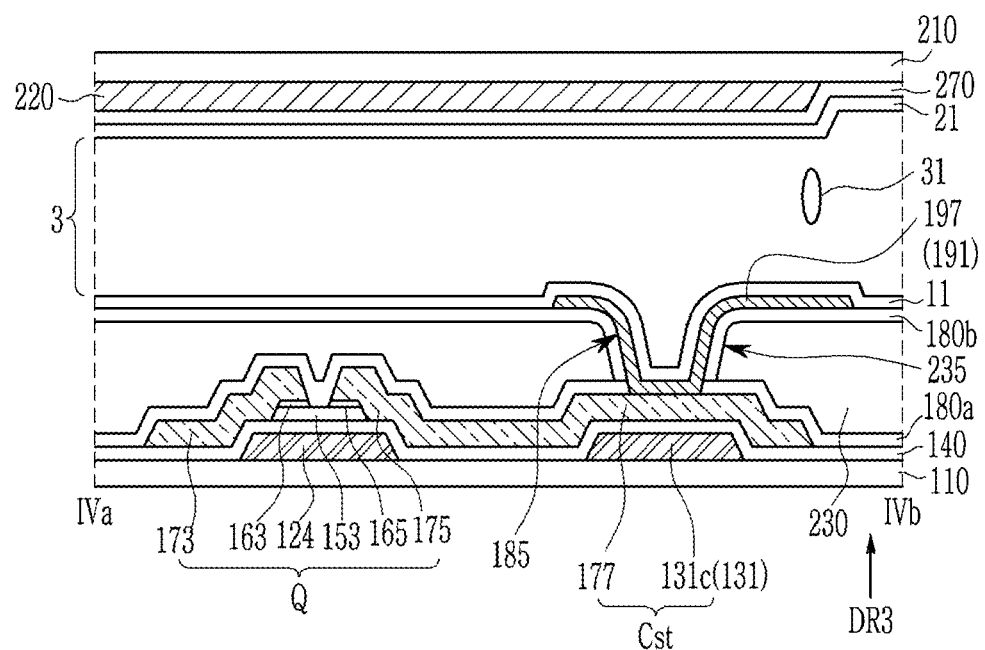
FIG. 4 is a cross-sectional view taken along line IVa-IVb of the display device of FIG. 2.

Referring to FIG. 2 and FIG. 3, the overall shape of the pixel electrode 191 may be substantially quadrangular, and may include a pattern where the pixel electrode 191 is partially removed. According to the pattern of the pixel electrode 191, the pixel electrode 191 may include a first sub-electrode 191a, a second sub-electrode 191b, a connector 195, extensions 196a and 196b, and an expanded part 197.

The first sub-electrode 191a and the second sub-electrode 191b are adjacent to each other in the first direction DR1 via a gap 91 where the pixel electrode layer is removed, and are electrically connected to each other through the connector 195. The gap 91 may extend in a direction substantially parallel to the second direction DR2. The width of the gap 91 in the first direction DR1 may be substantially uniform, or may be changed along the second direction DR2. Similarly, the width of the gap in the first direction DR1 between two pixel electrodes 191 adjacent in the first direction DR1 may be substantially uniform, or may be changed along the second direction DR2.

Each of the first sub-electrode 191a and the second sub-electrode 191b may include transverse stems 192a and 192b, longitudinal stems 193a and 193b, and a plurality of branches 194a and 194b. The transverse stems 192a and 192b extend in a direction substantially parallel to the first direction DR1, and the longitudinal stems 193a and 193b are connected to the transverse stems 192a and 192b in a crossed shape and extend in a direction substantially parallel to the second direction DR2. The sub-electrodes 191a and 191b may be divided into four sub-regions R1, R2, R3, and R4, and R1', R2', R3', and R4', by the transverse stems 192a and 192b and the longitudinal stems 193a and 193b.

The width of the longitudinal stems 193a and 193b in the first direction DR1 may be substantially uniform or may be changed along the second direction DR2. Likewise, the width of the transverse stems 192a and 192b in the second direction DR2 may be substantially uniform or may be changed along the second direction DR2.

The plurality of branches 194a and 194b are respectively disposed in four sub-regions R1, R2, R3, and R4, and R1', R2', R3', and R4', and are connected to the transverse stems 192a and 192b and the longitudinal stems 193a and 193b. The branches 194a and 194b disposed in each of the sub-regions R1, R2, R3, and R4, and R1', R2', R3', and R4', extend in an oblique direction toward the first direction DR1 and the second direction DR2, and the extending direction may form an angle of about 45 degrees or 135 degrees with the first direction DR1 and the second direction DR2, however the inventive concepts are not limited thereto. In one of the sub-electrodes 191a and 191b, the branches 194a and 194b disposed at two sub-regions R1 and R2, R3 and R4, R1' and R2', and R3' and R4' facing each other with the longitudinal stems 193a or 193b interposed therebetween, extend in the different directions from each other.

A slit 94 is formed between the adjacent branches 194a and 194b. In one of the sub-electrodes 191a and 191b, a pitch of the branches 194a and 194b or a pitch of the plurality of slits 94 may be substantially uniform or may be different depending on the position. Also, the width of the branches 194a and 194b in a direction perpendicular to the extending direction of each of the branches 194a and 194b may be substantially uniform or may be different from each other depending on its position in one of the sub-electrodes 191a and 191b. Likewise, the width of the slit 94 in a direction substantially perpendicular to the extending direction of each slit 94 may be substantially uniform or may be different depending its position in one of the sub-electrodes 191a and 191b.

For example, the pitch of the plurality of branches 194a and 194b or the pitch of the plurality of slits 94 may be about 6 micrometers, and in this case, the width of the branches 194a and 194b may be about 3.4 micrometers, and the width of the slit 94 may be about 2.6 micrometers, but the inventive concepts are not limited thereto.

Referring to FIG. 3, the length L1 of the sub-regions R1 and R2, and R1' and R2' in the second direction DR2, positioned upward with respect to the transverse stems 192a and 192b, and the length L2 of the sub-region R3 and R4, and R3' and R4' in the second direction DR2, positioned downward with respect to the transverse stems 192a and 192b, may be about the same or may be different from each other.

The width W1 and W2 of two sub-regions R1 and R2, R3 and R4, R1' and R2', and R3' and R4' facing each other via the longitudinal stems 193a and 193b in the first direction DR1 or may be the same or different from each other. More particularly, the widths of two portions in the first direction DR1 (or two sub-regions R1 and R2, R3 and R4, R1' and R2', and R3' and R4') positioned at the sides opposite to each other with respect to the longitudinal stems 193a and 193b in each of the sub-electrodes 191a and 191b may be the same or different from each other. For example, in the first sub-electrode 191a, the width W1 from the left edge of the longitudinal stem 193a to the end (or the left edge of the first sub-electrode 191a) of the branches 194a positioned at the left side with respect to the longitudinal stem 193a in the first direction DR1 may be the same or different from the width W2 from the right edge of the longitudinal stem 193a to the end (or the right edge of the first sub-electrode 191a) of the branches 194a positioned at the right side with respect to the longitudinal stem 193a in the first direction DR1. FIG. 2 exemplary shows where the two widths W1 and W2 are different from each other.

More particularly, in each of the sub-electrodes 191a and 191b, among two portions positioned at the opposite sides with respect to the longitudinal stems 193a and 193b, the width W1 of one portion closer to or adjacent to the outer edge of the pixel electrode 191 in the first direction DR1 may be less than the width W2 of the other portion closer to or adjacent to the gap 91 in the first direction DR1. That is, the width W1 of the sub-regions R1, R2, R3, and R4, and R1', R2', R3', and R4' positioned at the outer side with respect to the longitudinal stems 193a and 193b in the first direction DR1 may be less than the width W2 of the sub-regions R1, R2, R3, and R4, and R1', R2', R3', and R4' positioned at the inside with respect to the longitudinal stems 193a and 193b, that is, of the sub-regions R1, R2, R3, R4, R1', R2', R3', and R4' adjacent to the gap 91 in the first direction DR1. Accordingly, the width of the branches 194a and 194b positioned at the sub-regions R1, R2, R3, and R4, in which the width in the first direction DR1 is relatively smaller, may be further shorter.

The first and second sub-electrodes 191a and 191b of one pixel electrode 191 may have a shape that is symmetrical to each other with respect to the gap 91.

The connector 195 may be positioned between the transverse stems 192a and 192b of the first and second sub-electrodes 191a and 191b, and may be connected to the transverse stems 192a and 192b.

The widths W1 and W2 of the sub-regions R1, R2, R3, and R4, and R1', R2', R3', and R4', in the first direction DR1 may be about 11 micrometers or more.

In a plan view, a pair of longitudinal stems 193a and 193b of one pixel electrode 191 overlap a pair of data lines 171a and 171b overlapping the corresponding pixel electrode 191, respectively, and may extend substantially parallel to the data lines 171a and 171b. A pair of data lines 171a and 171b may overlap the intersection of the transverse stems 192a and 192b and the longitudinal stems 193a and 193b, while passing each of the sub-electrode 191a and 191b. Accordingly, each of the data lines 171a and 171b may be positioned at the boundary substantially parallel to the second direction DR2, and may extend along the boundary, among the boundaries between four sub-regions R1, R2, R3, and R4, and R1', R2', R3', and R4' of the corresponding sub-electrodes 191a and 191b.

The widths of the longitudinal stems 193a and 193b and the data lines 171a and 171b overlapping each other in the first direction DR1 may be substantially the same as each other or may have a slight difference. For convenience of description, FIG. 2 exemplarily shows that the width of the data lines 171a and 171b in the first direction DR1 is slightly greater than the width of the corresponding longitudinal stems 193a and 193b in the first direction DR1, however the inventive concepts are not limited thereto, and the width of the data lines 171a and 171b in the first direction DR1 may be the same as or smaller than the width of the longitudinal stems 193a and 193b in the first direction DR1.

The data lines 171a and 171b may be curved at the curved part CV (see FIG. 2) out of the region overlapping the longitudinal stems 193a and 193b, and are connected to the thin film transistor Q, as shown in FIG. 2.

The extension 196a may be connected to the left-lower corner of the first sub-electrode 191a, and the extension 196b may be connected to the right-lower corner of the second sub-electrode 191b. Two extensions 196a and 196b are connected to the expanded part 197, and may be positioned at the opposite sides via the expanded part 197 under the first and second sub-electrodes 191a and 191b. The expanded part 197 may be positioned to be aligned with the gap 91. The expanded part 197, in a plan view, overlaps the expanded part 177 of the drain electrode 175 of the thin film transistor Q, and is in contact with the expanded part 177 of the drain electrode 175 through the contact hole 185 to be electrically connected, thereby receiving the data voltage.

The width of the pixel electrode 191 in the first direction DR1 may be about 40 micrometers to 70 micrometers, however the inventive concepts are not limited thereto, and the width of the pixel electrode 191 may be changed depending on a design condition of the display device 1000a.

The end portions of the left/right edges of the pixel electrode 191 may overlap the extension 131b of the storage electrode line 131, as shown in FIG. 2, or alternatively may not overlap the extension 131b.

The shielding electrode 199 is separated from the pixel electrode 191, and extends in a direction substantially parallel to the first direction DR1. One shielding electrode 199 may be positioned between two pixel rows PXR adjacent in the second direction DR2. The shielding electrode 199 overlaps at least a part of the gate line 121, thereby preventing the leakage of light that may be generated near the gate line 121.

A light blocking member 220 may be disposed under the second substrate 210. The light blocking member 220 may block the leakage of light between adjacent pixel electrodes 191. Particularly, the light blocking member 220 may be mainly disposed at the region between the pixel electrodes 191 adjacent in the second direction DR2, and may extend in a direction mainly parallel to the first direction DR1. In a plan view, the light blocking member 220 covers most of the region where the thin film transistor Q, the gate line 121, and the drain electrode 175 are disposed, thereby preventing the leakage of light.

On the other hand, the extension 131b of the above-described storage electrode line 131 overlaps most of the space between two pixel electrodes 191 adjacent in the first direction DR1, thereby preventing the leakage of light between the adjacent pixel electrodes 191.

Figure 5:
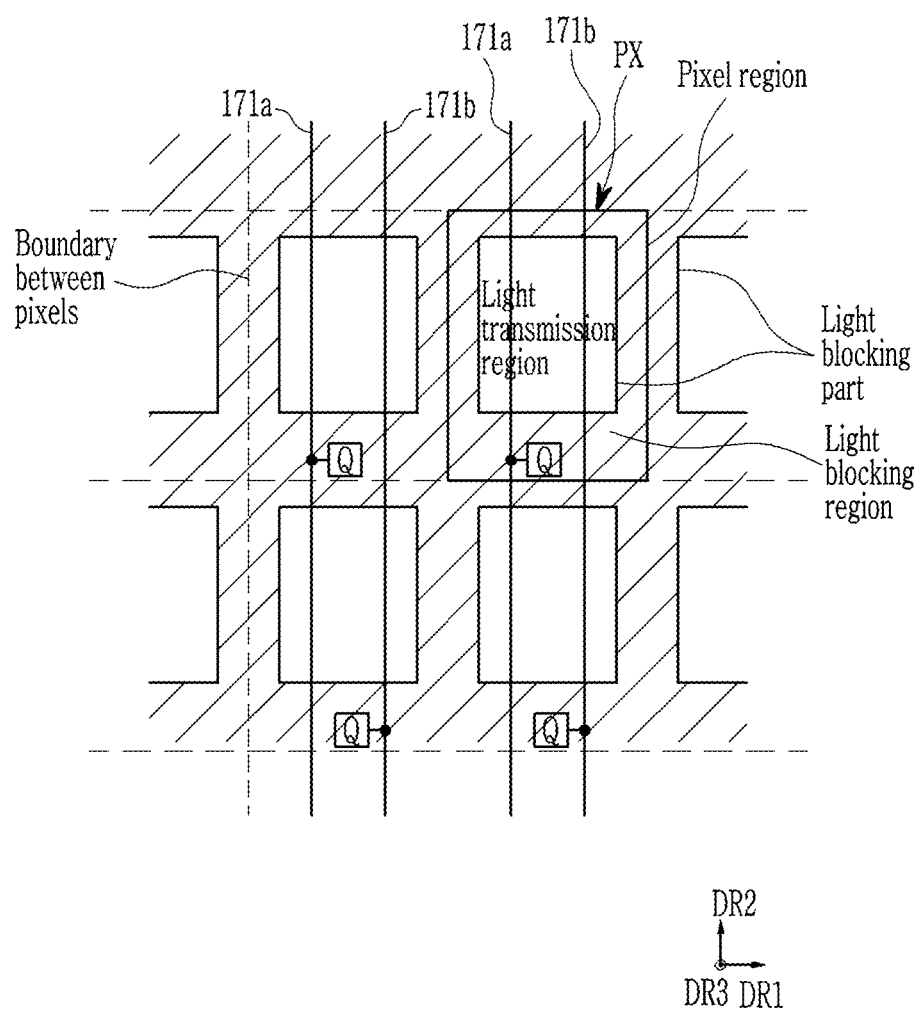
FIG. 5 is a schematic layout view of a display area of a display device according to an exemplary embodiment.

Referring to FIG. 5, as described above, the light blocking part having a lattice shape may be formed by the light blocking member 220 and the extension 131b of the storage electrode line 131. The light blocking part may cover the boundaries between adjacent pixels PX, thereby preventing the leakage of light. The region enclosed by the light blocking part may be one entire light transmitting region of each pixel PX. As described above, the pixel area enclosed by the boundaries between adjacent pixels PX may include the light transmitting region and the light blocking region. The light blocking part may be referred to as a group of the light blocking regions of the plurality of pixels PX. A pair of data lines 171a and 171b corresponding to one pixel column crosses the portion extending in a direction substantially parallel to the first direction DR1 of the light blocking region of the light blocking part having the lattice shape, but may extend along a direction parallel to a portion extending in the direction parallel to the second direction DR2 without being overlapped.

A common electrode 270 may be disposed under the second substrate 210 and the light blocking member 220. The common electrode 270 may be continuously formed on most of the region corresponding to the display area DA. The common electrode 270 may include the transparent conductive material, such as ITO, IZO, etc., or metal, such as aluminum, silver, chromium, or alloys thereof. The common electrode 270 may not be patterned to include the slit, etc., however, according to an exemplary embodiment, the common electrode 270 may include a slit or a cutout.

The color filter layer 230 is described as being disposed on the first substrate 110, however, the inventive concepts are not limited thereto, and the color filter layer 230 may be disposed between the second substrate 210 and the common electrode 270.

The liquid crystal layer 3 may include liquid crystal molecules 31 having negative dielectric anisotropy. The liquid crystal molecules 31 may be aligned, such that long axes thereof may be substantially perpendicular to or arranged with an acute angle with the surface of the first and second substrates 110 and 210 when an electric field is not applied to the liquid crystal layer 3. The liquid crystal molecules 31 may be pretilted by the fringe field formed between the edges of the patterned portions (e.g., the branches 194a and 194b) of the pixel electrode 191 and the common electrode 270.

An alignment layer 11 may be disposed on the pixel electrode 191 and the second insulating layer 180b, and an alignment layer 21 may be disposed on the common electrode 270. The two alignment layers 11 and 21 may be vertical alignment layers. A plurality of polymer protrusions, which may be formed by reacting a reactive monomer (RM) with light, such as ultraviolet rays, may be disposed at the surface of the alignment layers 11 and 21 adjacent to the liquid crystal layer 3. The polymer protrusions may cause the liquid crystal molecules 31 of the liquid crystal layer 3 to maintain their pretilt angles.

In the display device 1000a according to an exemplary embodiment, when the data voltage is applied to the pixel electrode 191 and the common voltage is applied to the common electrode 270, the electric field is generated to the liquid crystal layer 3. The electric field may include a vertical component in a direction substantially perpendicular to the surface of the first and second substrates 110 and 210, and may have a fringe field component, which are formed by the edges of the patterns, such as the transverse stems 192a and 192b, the longitudinal stems 193a and 193b, and the plurality of branches 194a and 194b of the pixel electrode 191. In response to the electric fields, the liquid crystal molecules 31 may be inclined in a direction substantially parallel to the surface of the first and second substrates 110 and 210, and a portion of the liquid crystal molecules 31 positioned in the region of the branches 194a and 194b are inclined toward inside of each of the branches 194a and 194b by the fringe field, and a portion of the liquid crystal molecules 31 are inclined in a direction of the extending direction of the branches 194a and 194b. Accordingly, the liquid crystal layer 3 corresponding to each of the sub-electrodes 191a and 191b may be divided into four regions, where the liquid crystal molecules 31 have inclination directions different from each other. These four regions correspond to the four sub-regions R1, R2, R3, and R4, and R1', R2', R3', and R4', of each of the sub-electrodes 191a and 191b described above.

The liquid crystal molecules 31 disposed in the inner regions of the sub-regions R1, R2, R3, and R4, and R1', R2', R3', and R4', where the branches 194a and 194b are arranged, may be arranged in a direction forming about 45 degrees with a direction parallel to the first direction DR1, thereby providing a high transmittance. The liquid crystal molecules 31 disposed at a region near the outer edge of the branches 194a and 194b be arranged in a direction substantially parallel to the first direction DR1, as compared with the liquid crystal molecules 31 disposed in the region where the branches 194a and 194b are arranged, which may contribute to better visibility. The liquid crystal molecules 31 disposed in the region corresponding to the longitudinal stems 193a and 193b or in the region corresponding to the gap 91 may be mainly arranged in a direction substantially parallel to the second direction DR2, and thus, the transmittance thereof may be relatively low.

As described above, a display device according to an exemplary embodiment includes a pair of data lines 171a and 171b that extend and pass through the inside of the light transmitting region of the pixels PX of a pixel column. Since the data lines 171a and 171b overlap the longitudinal stems 193a and 193b, the display device may have improved visibility and transmittance.

When a pair of data lines 171a and 171b are positioned per one pixel column PXC, the data lines 171a and 171b may be positioned at the light blocking region between two adjacent pixel columns PXC. However, in this case, two data lines 171a and 171b of different pixel columns PXC are formed close to each other, which may increase the risk electrically short, as well as increasing crosstalk between adjacent data lines 171a and 171b. Also, when the layers are misaligned during the manufacturing process of the display device, the area of the overlapping region between the data lines 171a and 171b and the pixel electrode 191 may be easily changed, which may increase an influence from the change in parasitic capacitance. As such, a display device according to an exemplary embodiment includes a pair of data lines 171a and 171b that overlap the inside of the pixel electrode 191 positioned at the corresponding pixel column PXC, which may reduce the risk of electrical short and crosstalk between the data lines 171a and 171b, and prevent the change of parasitic capacitance between the data lines 171a and 171b and the pixel electrode 191.

Since the data lines 171a and 171b are opaque, light may not be transmitted in the region where a pair of data lines 171a and 171b overlap the light transmitting region of the pixel PX. According to an exemplary embodiment, one pixel electrode 191 is divided into the first and second sub-electrodes 191a and 191b, and the longitudinal stems 193a and 193b of the first and second sub-electrodes 191a and 191b are formed to overlap the pair of data lines 171a and 171b. In this manner, the regions corresponding to the longitudinal stems 193a and 193b that have low transmittance and visibility substantially overlap the region where the data lines 171a and 171b are positioned, thereby effectively preventing low transmittance.

Figure 6:
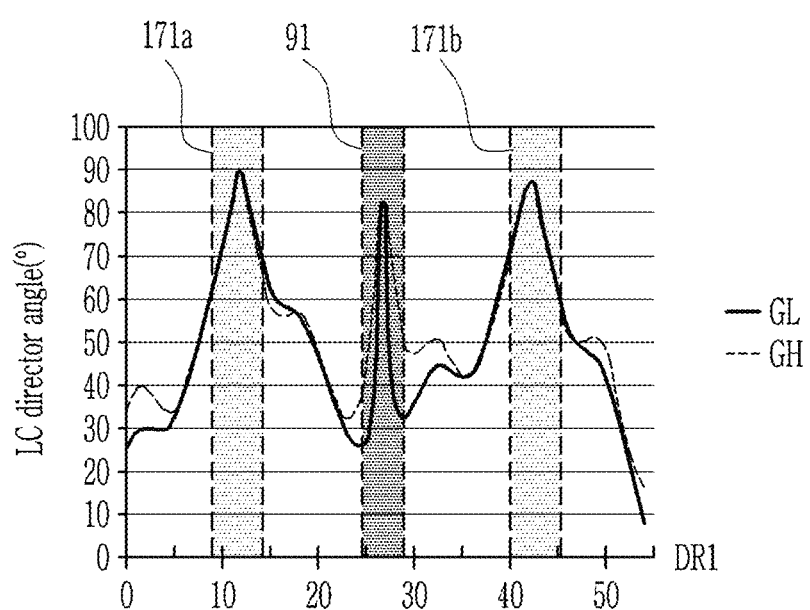
FIG. 6 is a graph showing an angle of an alignment direction of a liquid crystal molecule of a display device according to an exemplary embodiment.

FIG. 6 is a graph showing an angle of an alignment direction of liquid crystal molecules of a display device according to an exemplary embodiment. More particularly, a first curve GL of FIG. 6 represents an angle of the direction that the liquid crystal molecules 31 are inclined with respect to the first direction DR1 along the first direction DR1 that does not overlap the transverse stems 192a and 192b, when a low gray voltage (e.g., 3 V) is applied to the pixel electrode 191. A second curve GH of FIG. 6 represents an angle of the direction that the liquid crystal molecules 31 are inclined with respect to the first direction DR1 along the first direction DR1 that does not overlap the transverse stems 192a and 192b, when a high gray voltage (e.g., 7 V) is applied to the pixel electrode 191.

Referring to FIG. 6, in the regions where the longitudinal stems 193a and 193b and the data lines 171a and 171b are positioned, and the region where the gap 91 is formed, the angle of the inclined direction (hereinafter, referred to as "a director angle") of the liquid crystal molecule 31 is about 90 degrees, and light may not be substantially transmitted in these regions. Through the first curve GL and the second curve GH of FIG. 6, it may be confirmed that an average director angle of the liquid crystal molecules 31 is about 46.7 degrees when the voltage of the high gray is applied to the pixel electrode 191, and the average director angle of the liquid crystal molecules 31 is about 41.7 degrees when the voltage of the low gray is applied to the pixel electrode 191. As described above, it may be confirmed that the visibility is improved as the average director angle of the liquid crystal molecules 31 increases by about 5 degrees when the voltage of the high gray is applied to the pixel electrode 191 as compared with when the voltage of the low gray is applied. Also, because the average director angle of the liquid crystal molecule 31 may be close to about 45 degrees, the transmittance thereof is also improved.

More particularly, as described above, among four sub-regions R1, R2, R3, and R4, and R1', R2', R3', and R4', of each sub-electrodes 191a and 191b, the width W1 of the sub-regions R1, R2, R3, R4, R1', R2', R3', and R4' positioned outer part of the pixel PX with respect to the data lines 171a and 171b in the first direction DR1 may be less than the width W2 of the sub-regions R1, R2, R3, R4, R1', R2', R3', and R4' inside in the first direction DR1. In this case, since the data lines 171a and 171b are closer to the outside than the center of each of the sub-electrodes 191a and 191b, the width WC1 of the curved part CV of the data lines 171a and 171b may become shorter in the first direction DR1. Since the curved part CV of the data lines 171a and 171b is the portion positioned outside the longitudinal stems 193a and 193b of the sub-electrodes 191a and 191b, the curved part CV may deteriorate light transmittance. However, according to the illustrated exemplary embodiment, since the width WC1 of the curved part CV of the data lines 171a and 171b in the first direction DR1 is reduced, the area of the curved part CV may be also reduced, such that the transmittance reduction may be prevented.

Figure 7:
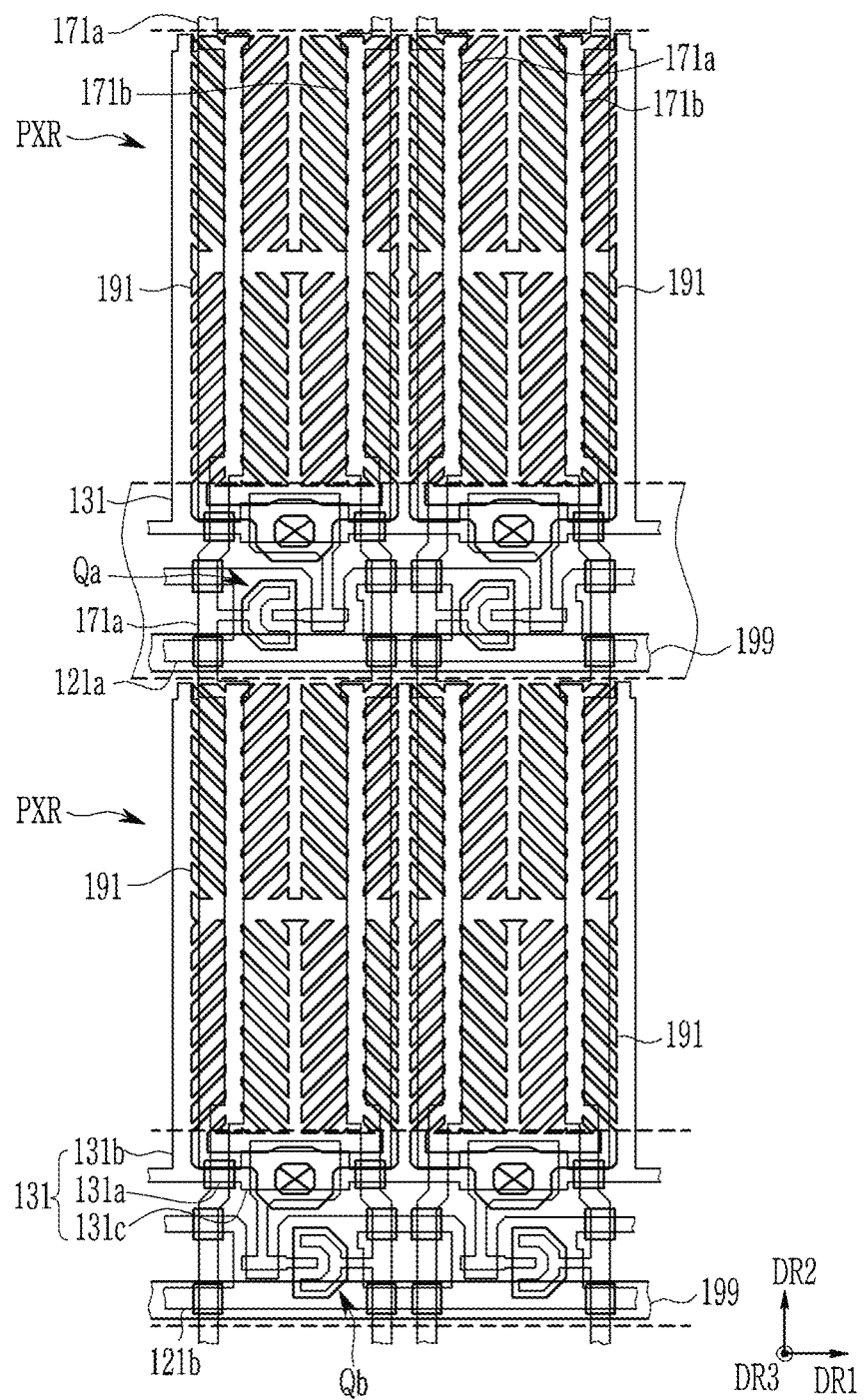
FIG. 7 is a plan layout view of four adjacent pixels of a display device according to an exemplary embodiment.

FIG. 7 is a plan layout view of four adjacent pixels PX of the display device 1000a described above with reference to FIG. 2 to FIG. 4, in which the pixel electrodes 191 disposed at the plurality of pixel rows PXR are connected to a pair of data lines 171a and 171b, as shown in FIG. 1.

Referring to FIG. 7, among the pixel rows PXR, the pixel electrode 191 of the upper pixel row PXR may be electrically connected to the thin film transistor Qa electrically connected to the first sub-gate line 121a and the data line 171a, and the pixel electrode 191 of the lower pixel row PXR may be electrically connected to the thin film transistor Qb electrically connected to the second sub-gate line 121b and the data line 171b. The first and second sub-gate lines 121a and 121b are electrically connected to each other as described above, thereby transmitting the same gate signal. As descried above, the pixel electrodes 191 of two adjacent pixel rows PXR in one pixel column may be alternately connected to the different data lines 171a and 171b through the thin film transistors Qa and Qb. A pair of data lines 171a and 171b corresponding to one pixel column PXC may extend across the pixel electrodes 191 of the corresponding pixel column PXC in a direction substantially parallel to the second direction DR2.

Figure 8:
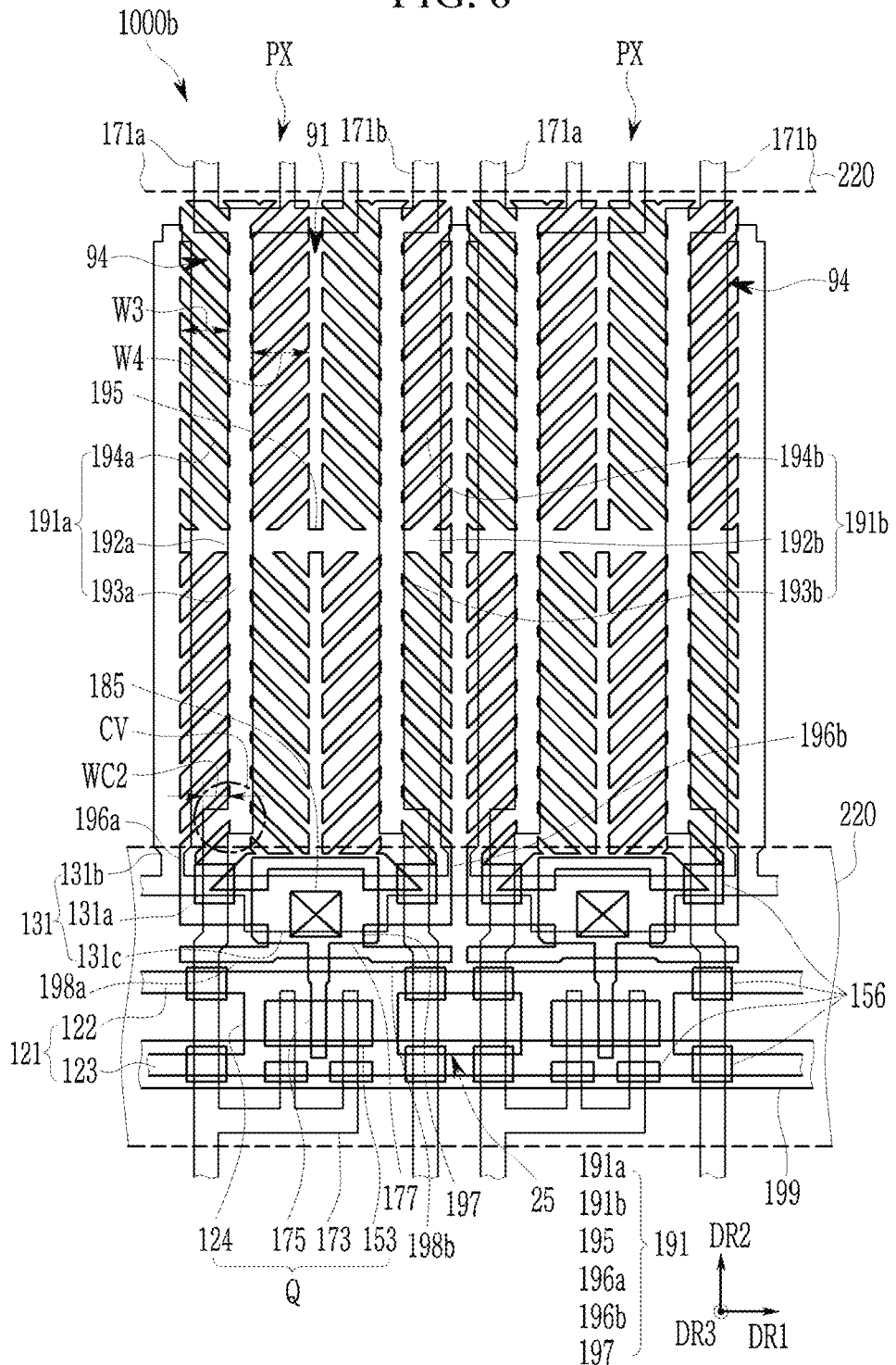
FIG. 8 is a plan layout view of two pixels of a display device according to an exemplary embodiment.

FIG. 8 is a plan layout view of two pixels of a display device according to an exemplary embodiment.

Referring to FIG. 8, a display device 1000b according to an exemplary embodiment is substantially similar to the display device 1000a described above, however some constituent elements thereof may have different shapes. The constituent elements having substantially the same connection relationship, but some differences in their shape, are denoted with the same reference numerals as those used in the above exemplary embodiments, and differences thereof are mainly described below.

One gate line 121 may include a pair of line portions 122 and 123. The pair of line portions 122 and 123 may extend substantially parallel to each other, and may respectively extend in a direction substantially parallel to the first direction DR1. A plurality of gate electrodes 124 are positioned between a pair of line portions 122 and 123, and the gate electrodes 124 are connected directly to the pair of line portions 122 and 123. As such, the pair of line portions 122 and 123 may be electrically connected to each other and may transmit the same gate signal. A hole 25 may be positioned between two gate electrodes 124 adjacent in the first direction DR1 as an opening. In particular, in the region where the gate electrode 124 is not formed, the pair of line portions 122 and 123 of the gate line 121 may be formed in parallel while facing each other with the hole 25 interposed therebetween.

The source electrode 173 connected to one of the data lines 171a and 171b may extend toward the gate electrode 124, and may be curved to have a substantially "U" shape.

The pixel electrode 191 is substantially the same as the pixel electrode 191 of the display device 1000a described above, however the pixel electrode 191 according to an exemplary embodiment may further include a pair of protrusions 198a and 198b protruded from the expanded part 197, which cross and overlap a pair of data lines 171a and 171b. Each of the protrusions 198a and 198b may extend in a direction substantially parallel to the first direction DR1. According to an exemplary embodiment, at least one of the pair of protrusions 198a and 198b may be omitted.

Similar to the above-described display device 1000a, in each of the first and second sub-electrodes 191a and 191b, the width W3 from the edge of the branches 194a and 194b positioned at the left side of the longitudinal stems 193a and 193b to the left edge of the longitudinal stems 193a and 193b in the first direction DR1 may be the same as or different from the width W4 from the edge of the branches 194a and 194b positioned at the right side of the longitudinal stems 193a and 193b to the right edge of the longitudinal stems 193a and 193b in the first direction DR1. Particularly, the width W3 of the branches 194a and 194b positioned at the outer part with respect to the longitudinal stems 193a and 193b in the first direction DR1 may be less than the width W4 of the branches 194a and 194b positioned at the inner part with respect to the longitudinal stems 193a and 193b in the first direction DR1.

Figure 9:
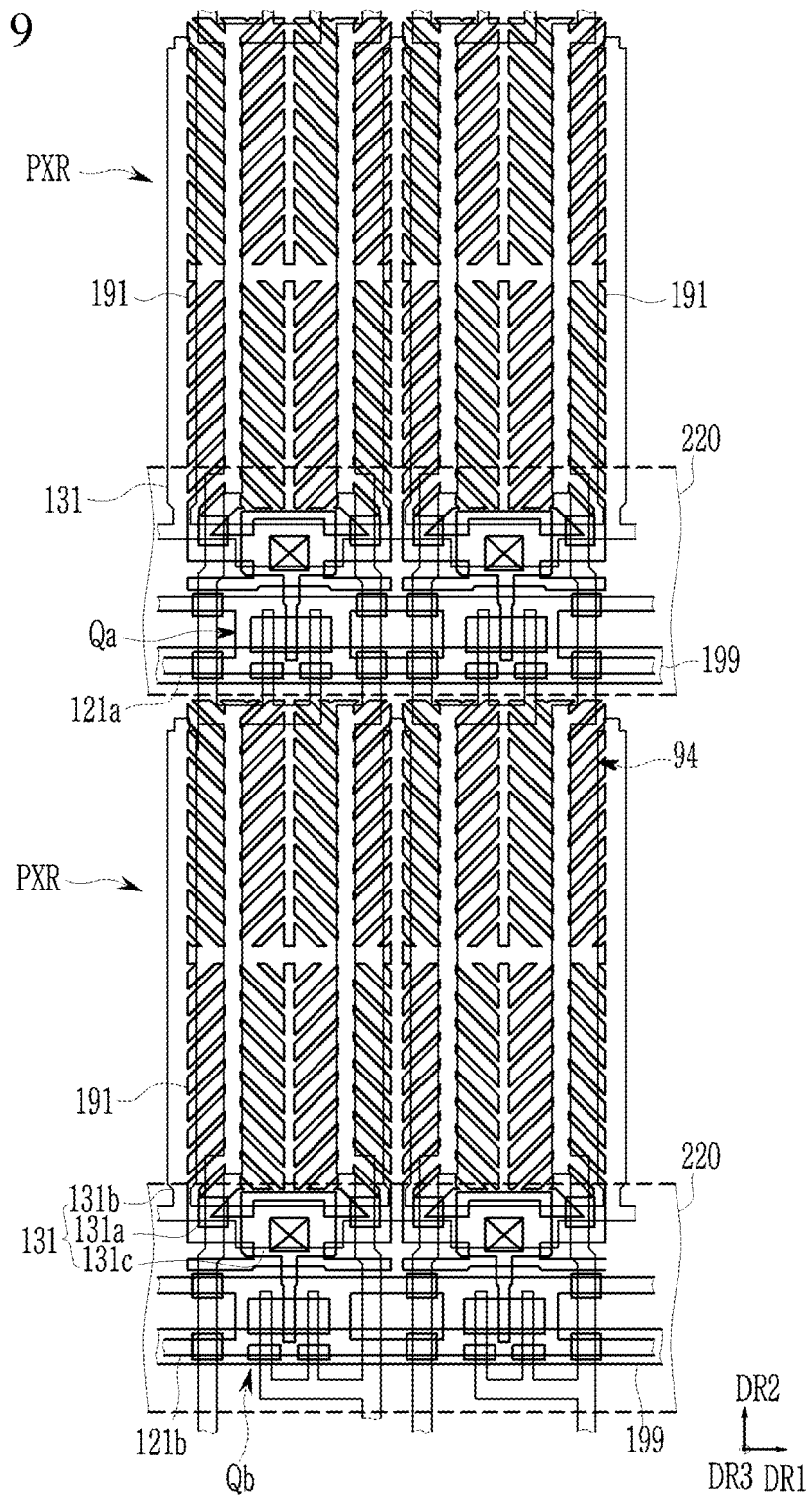
FIG. 9 is a plan layout view of four adjacent pixels of a display device according to an exemplary embodiment.

FIG. 9 is a plan layout view of four adjacent pixels of a display device according to an exemplary embodiment.

Referring to FIG. 9, the pixel electrodes 191 positioned at the plurality of pixel rows PXR are connected to a pair of data lines 171a and 171b, like those shown in FIG. 1. For example, among the pixel rows PXR shown in FIG. 9, the pixel electrode 191 of the upper pixel row PXR may be electrically connected to the thin film transistor Qa electrically connected to the first sub-gate line 121a and the data line 171a, and the pixel electrode 191 of the lower pixel row PXR may be electrically connected to the thin film transistor Qb electrically connected to the second sub-gate line 121b and the data line 171b. The first and second sub-gate lines 121a and 121b are electrically connected to each other as described above, thereby transmitting the same gate signal. As described above, in one pixel column, the pixel electrodes 191 of two adjacent pixel rows PXR may be alternately connected to the different data lines 171a and 171b through the thin film transistors Qa and Qb.

Next, a display device according to an exemplary embodiment is described with reference to FIG. 10 to FIG. 16, together with the above-described drawings.

Figure 10:
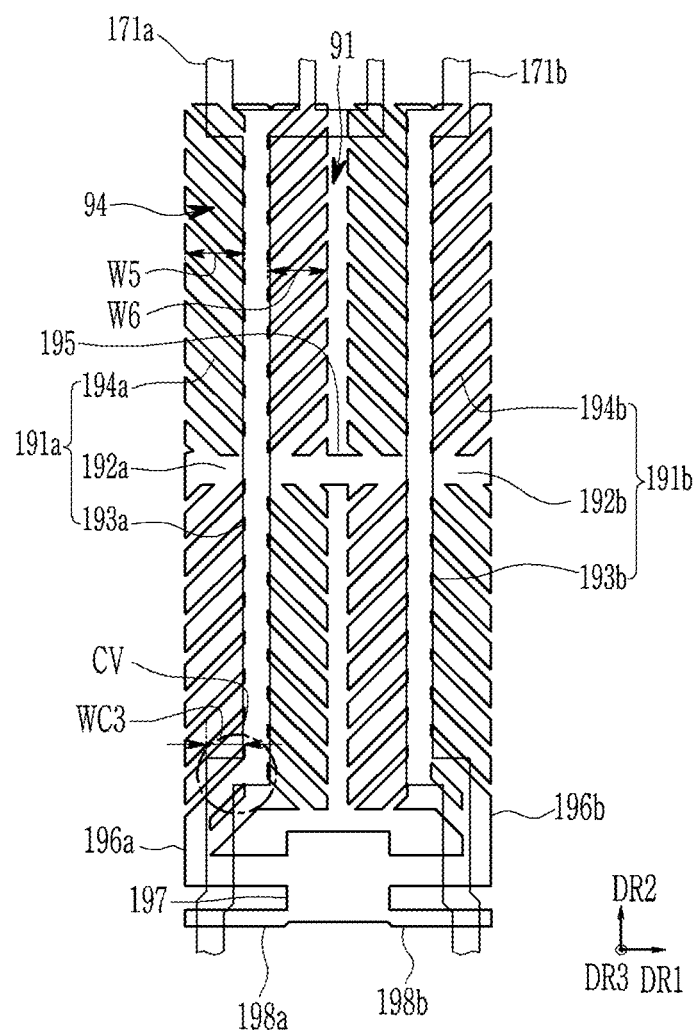
FIG. 10, FIG. 11, and FIG. 12 are top plan views of a pixel electrode and data lines of a display device according to exemplary embodiments.

Referring to FIG. 10, the display device according to an exemplary embodiment is substantially the same as those described above, particularly the display device shown in FIG. 8, however the shape of the pixel electrode 191 may be different therefrom.

More particularly, the width W5 from the edge of the branches 194a and 194b positioned at the left side of the longitudinal stems 193a and 193b to the left edge of the longitudinal stems 193a and 193b in the first direction DR1 is substantially the same as the width W6 from the edge of the branches 194a and 194b positioned at the right side of the longitudinal stems 193a and 193b to the right edge of the longitudinal stems 193a and 193b in the first direction DR1, in each of the first and second sub-electrodes 191a and 119b.

In this case, since the data lines 171a and 171b are positioned at the approximate center of each of the sub-electrodes 191a and 191b, the width WC3 of the curved part CV of the data lines 171a and 171b in the first direction DR1 may be greater than the width WC2 of the curved part CV of the data lines 171a and 171b in the first direction shown in FIG. 8. More particularly, since the data lines 171a and 171b and the longitudinal stems 193a and 193b overlapping thereto are positioned closer to the outer edge of the pixel electrode 191, the width WC2 of the curved part CV of the data lines 171a and 171b in the first direction DR1 is less than the width WC3 of the curved part CV of the data lines 171a and 171b in the first direction DR1 shown in FIG. 10, such that the transmittance reduction by the curved part CV may be reduced.

Figure 11:
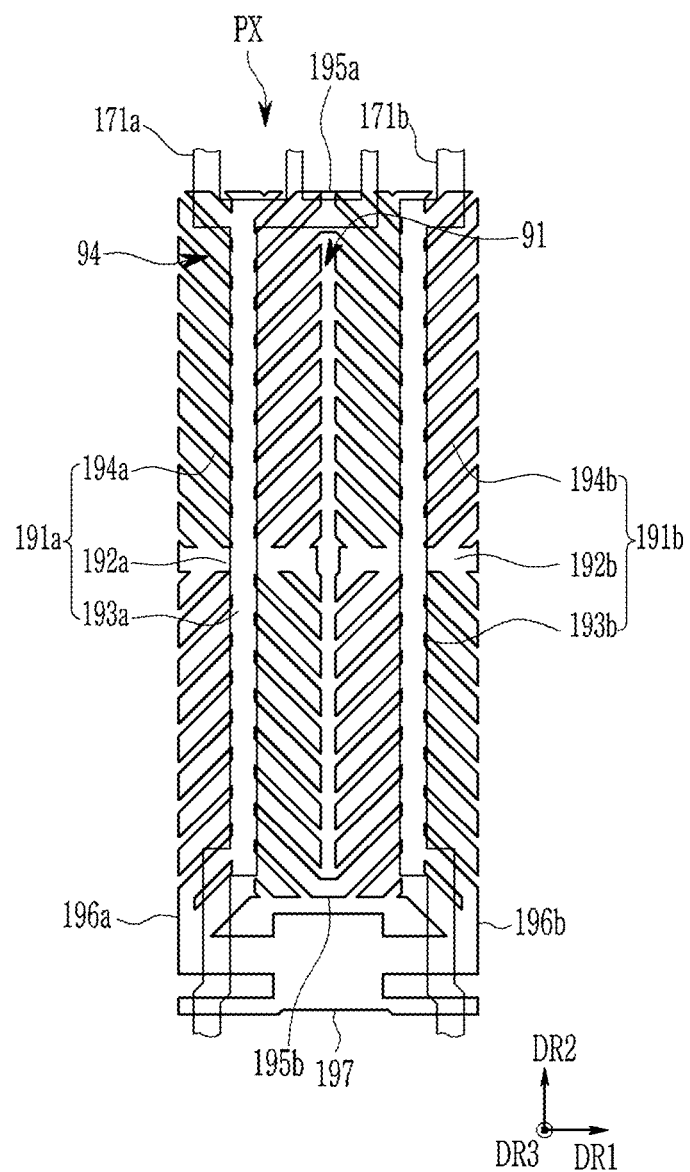

Referring to FIG. 11, the display device according to an exemplary embodiment is substantially the same as the display device described above, particularly to the display device shown in FIG. 8, however the shape of the pixel electrode 191 may be different therefrom.

The pixel electrode 191 may include connectors 195a and 195b positioned at the end portion above and/or below the first and second sub-electrodes 191a and 191b, which connect the first and second sub-electrodes 191a and 191b in addition to the above-described connector 195, or instead of the connector 195. FIG. 11 exemplarily shows that the connector 195 is omitted, and only the connectors 195a and 195b exist. The connectors 195a and 195b extend toward the outside of the pixel electrode 191, are positioned between the branches 194a and 194b of the first and second sub-electrodes 191a and 191b facing each other, and may be connected to these branches 194a and 194b.

Figure 12:
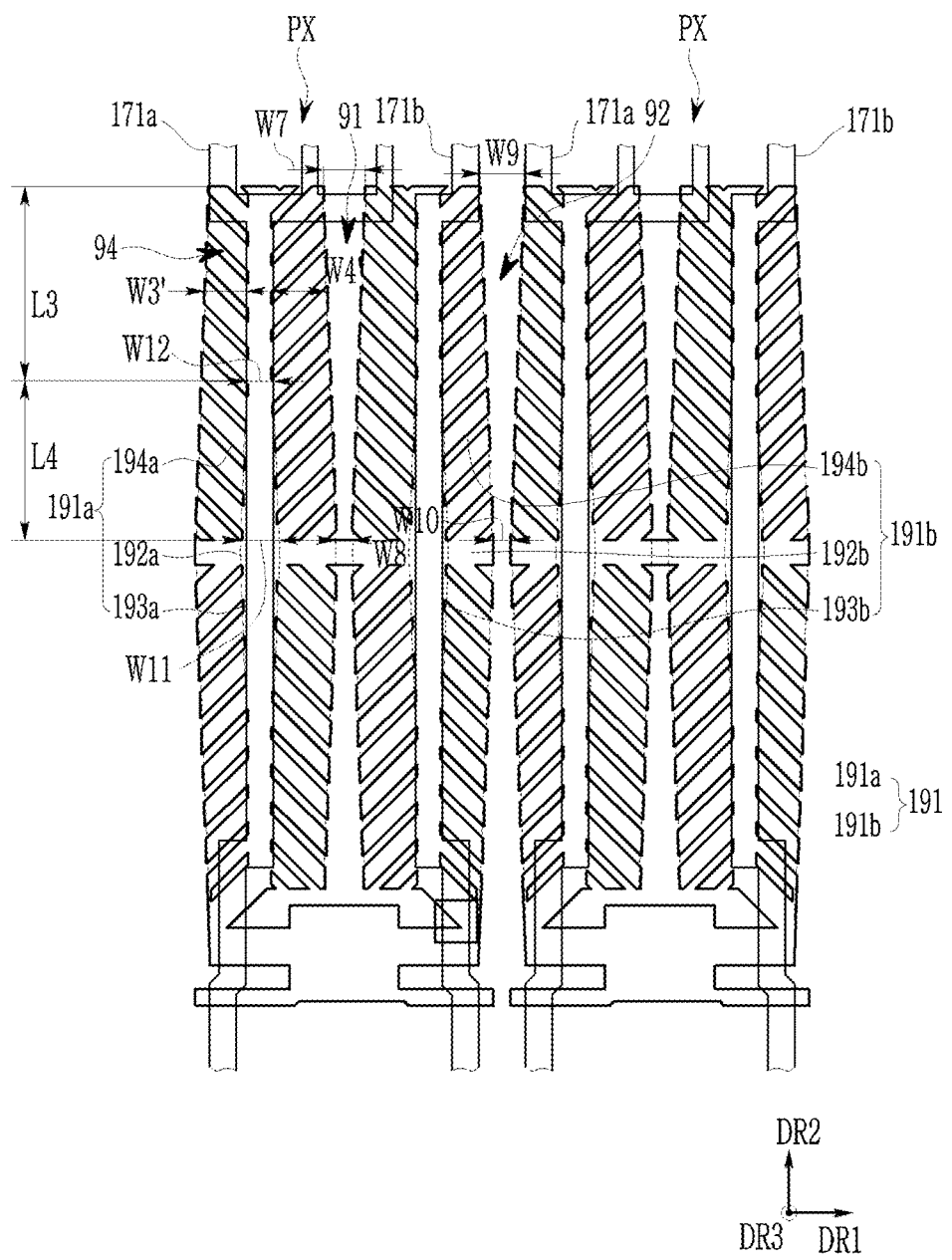

Referring to FIG. 12, the display device according to an exemplary embodiment is substantially the same as the display device described above, particularly to the display device shown in FIG. 8, however the shape of the pixel electrode 191 thereof may be different therefrom.

More particularly, the width of at least one of a gap 91 between the first and second sub-electrodes 191a and 191b and a gap 92 between two adjacent pixel electrodes 191 may be gradually changed in the first direction DR1 along the second direction DR2. In particular, the width of the gap 91 and/or the gap 92 in the first direction DR1 may increase further from the transverse stems 192a and 192b in a direction parallel to the second direction DR2. Accordingly, at the place farthest from the transverse stems 192a and 192b, the gap 92 and/or the widths W7 and W9 of the gap 92 in the first direction DR1 may be greater than the gap 92 and/or the widths W8 and W10 of the gap 92 in the first direction DR1 directly on the transverse stems 192a and 192b.

In each of the first and second sub-electrodes 191a and 191b, if the width from the edge of the branches 194a and 194b positioned at the left side of the longitudinal stems 193a and 193b to the left edge of the longitudinal stems 193a and 193b in the first direction DR1 is referred to as W3', and the width from the edge of the branches 194a and 194b at the right side of the longitudinal stems 193a and 193b to the right edge of the longitudinal stems 193a and 193b in the first direction is referred to a W4', the width W3' and the width W4' may be decreased away from the transverse stems 192a and 192b.

For example, the difference between the width W7 and the width W8, and the difference between the width W9 and the width W10 may be about 1 micrometer to about 2 micrometers, the width W7 and the width W9 may be about 4 micrometers to about 6 micrometers, and the width W8 and the width W10 may be about 3 micrometers to about 5 micrometers.

The width of at least a part of the longitudinal stems 193a and 193b in the first direction DR1 may be changed along the second direction DR2. Particularly, the width of the longitudinal stems 193a and 193b in the first direction DR1 may be increased further from the transverse stems 192a and 192b in a direction substantially parallel to the second direction DR2. That is, the direction in which the width in the first direction DR1 of the longitudinal stem 193a and 193b increases may be opposite to the direction in which the width of the gap 92 in the first direction DR1 increases.

The portion in which the width of the longitudinal stems 193a and 193b varies in the first direction DR1 may be the part of the longitudinal stems 193a and 193b. Referring to FIG. 12, in each of the sub-electrodes 191a and 191b, the length L4 in the second direction DR2 of the portion where the width of the first direction DR1 of the longitudinal stems 193a and 193b positioned at one side of the transverse stems 192a and 192b is changed may be different from or substantially the same as the length L3 in the second direction DR2 of the portion where the width of the first direction DR1 of the longitudinal stems 193a and 193b is substantially constant. The portion where the width of the longitudinal stems 193a and 193b is changed in the first direction DR1 may be directly adjacent to the transverse stems 192a and 192b.

At the portion (the portion indicated by L3) where the width of the longitudinal stems 193a and 193b in the first direction DR1 is substantially constant, the width W3' and the width W4' may be decreased away from the transverse stems 192a and 192b as described above. At the portion (the portion indicated by L4) where the width of the longitudinal stems 193a and 193b in the first direction DR1 is changed, the width W3' and the width W4' may be decreased, may be the same, or may be increased away from the transverse stems 192a and 192b. This may be changed according to the degree of change in width of the longitudinal stems 193a and 193b in the first direction DR1 and the degree of change in the first direction DR1 of the gap 91 and 92 at the portion (the portion indicated by L4) where the width of the longitudinal stems 193a and 193b in the first direction DR1 is changed.

At the portion where the width of the longitudinal stems 193a and 193b in the first direction DR1 is changed, the width W12 of the longitudinal stem 193a and 193b in the first direction DR1 at the place farthest from the transverse stems 192a and 192b may be less than the width W11 of the longitudinal stem 193a and 193b in the first direction DR1 right above (in plan view) the transverse stems 192a and 192b. For example, the difference between the width W11 and the width W12 may be about 1 micrometer to about 2 micrometers, the width W11 may be about 5 micrometers to about 7 micrometers, and the width W12 may be about 4 micrometers to about 6 micrometers.

The maximum widths W7 and W9 of the gap 91 or the gap 92 in the first direction DR1 may be less than the maximum width W11 of the longitudinal stems 193a and 193b in the first direction DR1, and the minimum widths W8 and W10 of the gap 91 or the gap 92 in the first direction DR1 may be less than the minimum width W12 of the longitudinal stems 193a and 193b in the first direction DR1, but the inventive concepts are not limited thereto.

As described above, according to the inclination structure in which the width of at least a part of the gap 91, the gap 92, or the longitudinal stems 193a and 193b in the first direction DR1 is changed along a direction parallel to the second direction DR2, the control force for the liquid crystal molecules 31 may be increased due to the fringe field by the edge of the inclination structure. Accordingly, a texture defect that may be generated between the adjacent pixel electrodes 191 in the first direction DR1 and between the adjacent first and second sub-electrodes 191a and 191b in the first direction DR1 may be prevented, and a response speed of the liquid crystal molecule 31 in response to the electric field may be increased.

Figure 13:
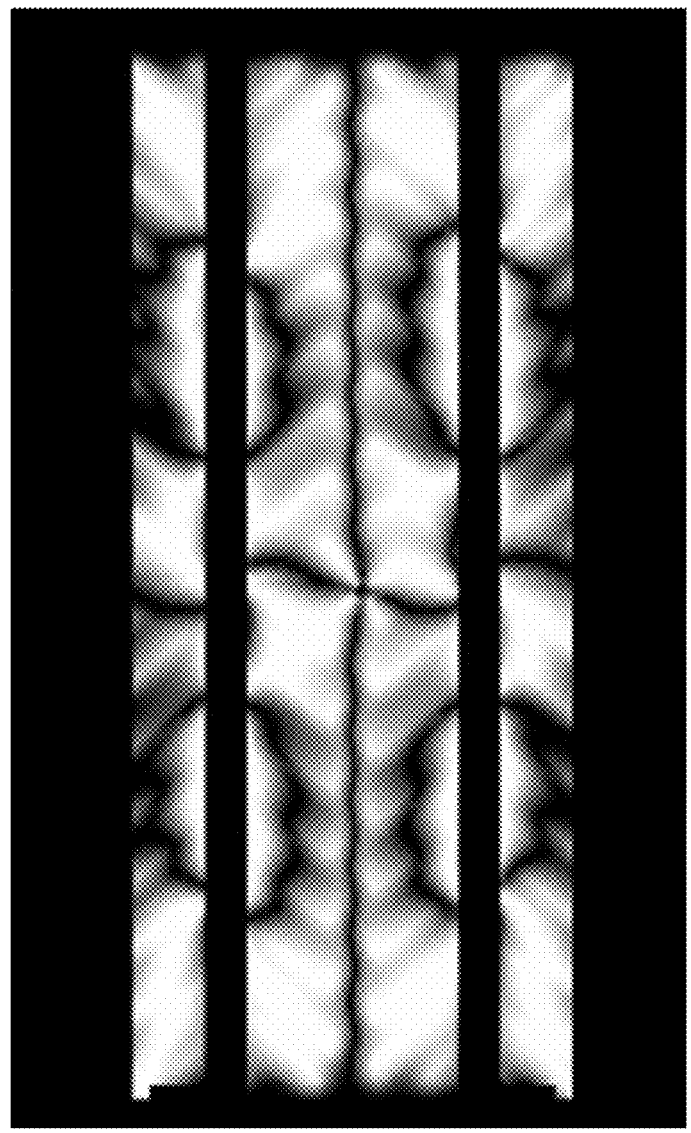
FIG. 13 and FIG. 14 are photographs of a pixel directly after a high gray voltage is applied to a pixel electrode of a display device according to an exemplary embodiment.
Figure 14:
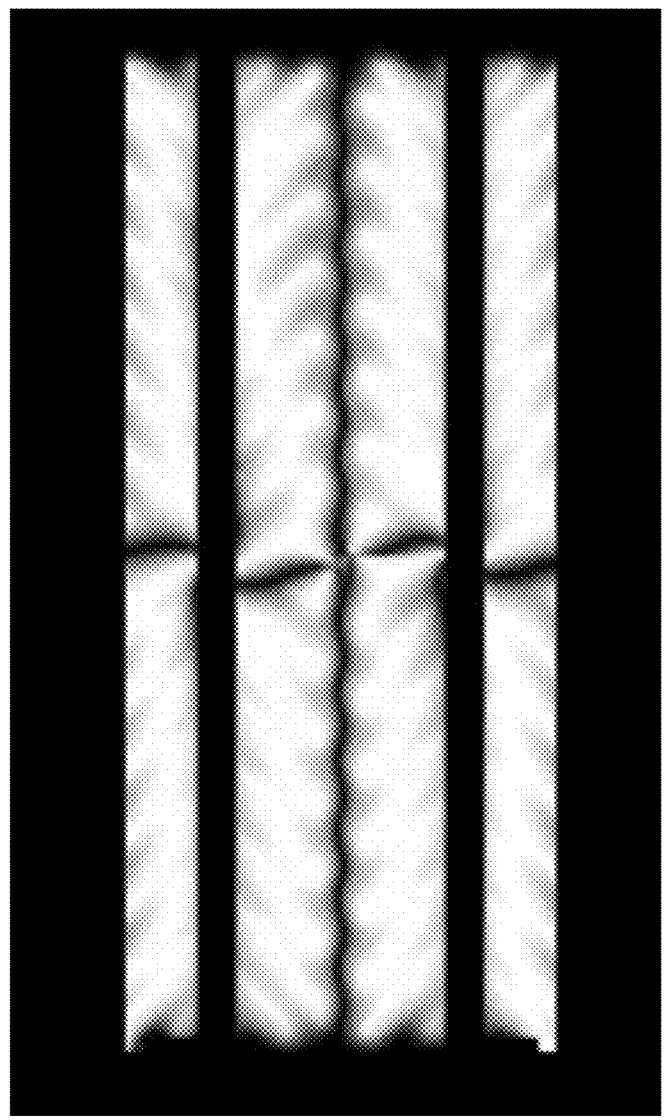

FIG. 13 is a photo of one pixel PX immediately after the high gray voltage is applied to the pixel electrode 191 of the display device without the inclination structure of FIG. 8, and FIG. 14 is a photo of one pixel PX directly after the high gray voltage is applied to the pixel electrode 191 of the display device having the inclination structure that the width of at least a part of the gap 91, the gap 92, or the longitudinal stems 193a and 193b in the first direction DR1 is changed along the direction parallel to the second direction DR2 as in FIG. 12.

In the image of the display device shown in FIG. 13, while most of the texture that is shown as partially dark regions may be disappeared with the passage of time, as compared to the image shown in FIG. 14, it may be confirmed that the texture appears at the partial region directly after the data voltage is applied to the pixel electrode due to reduced response speed of the liquid crystal molecules. On the other hand, as shown in the image of the display device of FIG. 14, it may be confirmed that the texture does not appear as that in FIG. 13, and most of the light transmitting region of pixel PX has high luminance.

That is, according to an exemplary embodiment, in a display device having the above-described inclination structure, the response speed of the liquid crystal molecules is faster and the direction control force for the liquid crystal molecules by the fringe field may be increased, thereby further increasing the transmittance.

Figure 15:
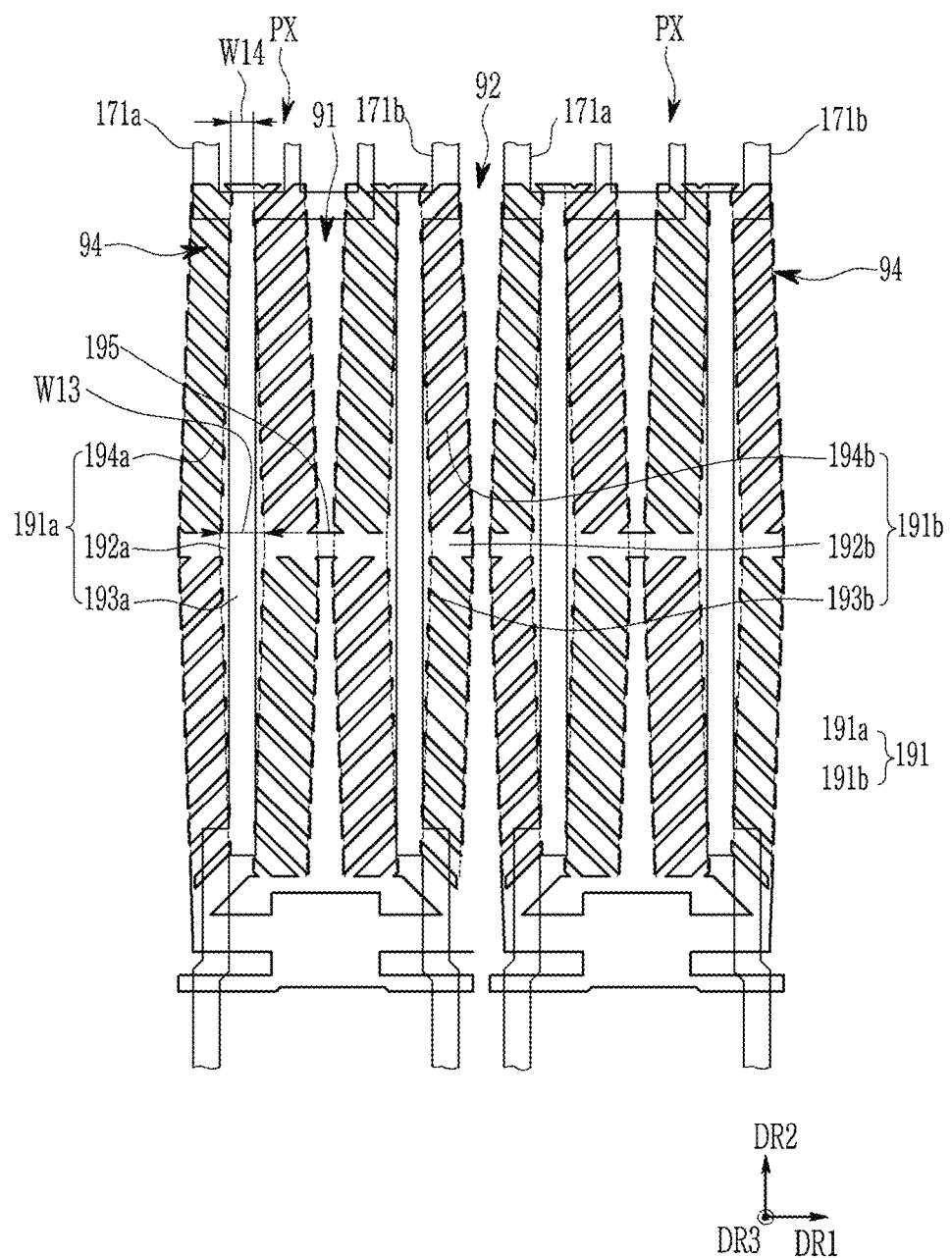
FIG. 15 and FIG. 16 are top plan views of a pixel electrode and data lines of a display device according to exemplary embodiments.

Referring to FIG. 15, a display device according to an exemplary embodiment is substantially the same as the display device shown in FIG. 12, however the portion where the width of the longitudinal stems 193a and 193b is changed in the first direction DR1 may be placed on substantially the entire corresponding longitudinal stems 193a and 193b. That is, the width of one of the longitudinal stems 193a and 193b in the first direction DR1 may be changed from the transverse stems 192a and 192b to the upper or lower end of the pixel electrode 191. The width of the longitudinal stems 193a and 193b in the first direction DR1 may be increased away from the transverse stems 192a and 192b along a direction parallel to the second direction DR2. At the place farthest from the transverse stems 192a and 192b, the width W14 of the longitudinal stems 193a and 193b in the first direction may be less than the width W13 of the longitudinal stems 193a and 193b in the first direction DR1 directly on the transverse stems 192a and 192b. For example, the difference between the width W13 and the width W14 may be about 1 micrometer to about 2 micrometers, the width W13 may be about 5 micrometers to about 7 micrometers, and the width W14 may be about 3 micrometers to about 5 micrometers.

Figure 16:
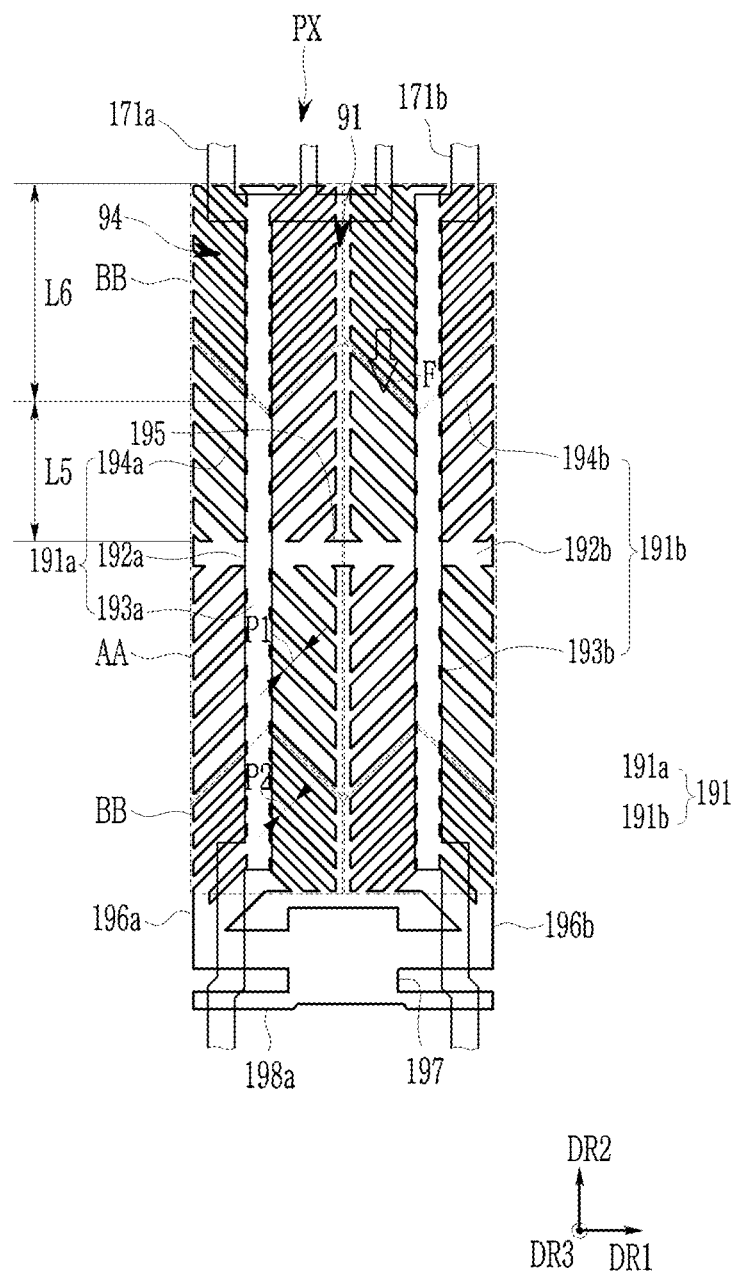

Referring to FIG. 16, a display device according to an exemplary embodiment is substantially the same as the display device shown in FIG. 8, however the pitch of the branches 194a and 194b or the pitch of the slits 94 may be different depending on the position at one of the sub-electrodes 191a and 191b, and the width of the branches 194a and 194b and/or the width of the slit 94 may be different depending on the position in the sub-electrodes 191a and 191b.

In detail, one of the sub-electrodes 191a and 191b may include a first region AA and a second region BB, in which the pitch (the same as the pitch of the slits 94) of the branches 194a and 194b are different from each other. Here, each of the first region AA and the second region BB may include the portion of the longitudinal stems 193a and 193b, in which the branches 194a and 194b are connected, a pair of second regions BB that are respectively positioned upward and downward with respect to the first region AA, and a pair of second regions BB that may be separated from each other and not connected. The first region AA may include the region where the transverse stems 192a and 192b are positioned.

The pitch P1 of the branches 194a and 194b in the first region AA may be greater than the pitch P2 of the branches 194a and 194b in the second region BB. For example, when the pitch P1 in the first region AA is about 6 micrometers, the pitch P2 may be about 5 micrometers in the second region BB, however the value is not limited thereto.

The width of the branches 194a and 194b in the first region AA may be different from the width of the branches 194a and 194b in the second region BB. In detail, the width of the branches 194a and 194b in the first region AA may be greater than the width of the branches 194a and 194b in the second region BB. For example, the width of the branches 194a and 194b in the first region AA may be about 3.4 micrometers and the width of the branches 194a and 194b in the second region BB may be about 2.4 micrometers. The width of the slit 94 of the first region AA and the width of the slit 94 of the second region BB may be the same as or different from each other.

In one of the sub-electrodes 191a and 191b, a ratio of the area occupied by the first region AA and the area occupied by the second region BB may be about 6:4 to about 5:5, however the inventive concepts are not limited thereto and the ratio may be variously changed.

According to an exemplary embodiment, at the boundary portion between the first region AA and the second region BB, in which the pitch of the branches 194a and 194b is changed, a differential fringe field F is generated such that the control force for the liquid crystal molecules 31 may be further increased. The direction of the differential fringe field F may be substantially parallel to the second direction DR2, and may be toward the transverse stems 192a and 192b.

Referring to FIG. 16, the boundary (indicated by a dotted line) between the first region AA and the second region BB may cross the portion of the longitudinal stems 193a and 193 positioned at one side of the transverse stems 192a and 192b. A distance L5 from a portion of the boundary between the first region AA and the second region BB that crosses the longitudinal stem 193a and 193b to the transverse stem 192a and 192b, and a distance L6 from the portion of the boundary between the first region AA and the second region BB that crosses the longitudinal stem 193a and 193b to the upper or lower end of the pixel electrode 191 may be different from each other as shown, or may be substantially the same.

In detail, the distance L5 may be smaller than or the same as the distance L6. When two distances L5 and L6 are the same, the crossing point of the boundary between the first region AA and the second region BB and the longitudinal stems 193a and 193b may be positioned at the approximate center portion of the longitudinal stems 193a and 193b positioned upward or downward with respect to the transverse stems 192a and 192b.

When the length one sub-electrode 191a and 191b in the second direction DR2 is greater than the length in the first direction DR1, the texture may be easily generated at the portion farthest from the end of the branches 194a and 194b (e.g., as shown in FIG. 13). That is, the texture may be easily generated at the center portion of the longitudinal stems 193a and 193b positioned at the upper side or the lower side with respect to the transverse stems 192a and 192b.

If the boundary between the first region AA and the second region BB, in which the pitch of the branches 194a and 194b is changed, crosses the center portion of the longitudinal stems 193a and 193b positioned at the upper side or the lower side with respect to the transverse stems 192a and 192b or the portion closer to the transverse stems 192a and 192b, the liquid crystal control force may be increased, at a portion where the texture would be easily generated, such that a texture control time may be greatly reduced and the texture may be improved. Accordingly, the transmittance of the display device is further increased and the visibility may be improved.

According to exemplary embodiments, the transmittance and the visibility of a display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a gate line;
   a first data line and a second data line adjacent to each other in a first direction and crossing the gate line;
   a first transistor electrically connected to the gate line and the first data line; and
   a first pixel electrode electrically connected to the first transistor,
   wherein:
   the first pixel electrode comprises a first sub-electrode and a second sub-electrode adjacent to each other in the first direction;
   the first sub-electrode comprises a first longitudinal stem extending in a direction substantially parallel to the first data line and overlapping the first data line, and a plurality of first branches connected to the first longitudinal stem;
   the second sub-electrode comprises a second longitudinal stem extending in a direction substantially parallel to the second data line and overlapping the second data line, and a plurality of second branches connected to the second longitudinal stem;
   a first gap extending in a second direction crossing the first direction is formed between the first sub-electrode and the second sub-electrode; and
   a width of the first gap in the first direction is gradually changed along the second direction.

2. The display device of claim 1, wherein:
   the first sub-electrode comprises a first portion and a second portion disposed at opposing sides of the first longitudinal stem, respectively; and
   a width of the first portion positioned at a first side of the first longitudinal stem in the first direction is different from a width of the second portion positioned at a second side of the first longitudinal stem in the first direction.

3. The display device of claim 2, wherein:
   the first portion is closer to an edge of the first pixel electrode than the second portion; and
   the width of the first portion in the first direction is less than the width of the second portion in the first direction.

4. The display device of claim 1, further comprising:
   a second pixel electrode adjacent to the first pixel electrode in the first direction; and
   a second gap extending in the second direction is formed between the first pixel electrode and the second pixel electrode,
   wherein a width of the second gap in the first direction is gradually changed along the second direction.

5. The display device of claim 1, wherein:
   a width of at least a part of the first longitudinal stem in the first direction is gradually changed along the second direction; and
   a direction in which the width of the first longitudinal stem in the first direction increases is opposite to a direction in which the width of the first gap in the first direction increases.

6. The display device of claim 1, wherein:
   the first sub-electrode comprises a first region where the first branches have a first pitch, and a second region where the first branches have a second pitch less than the first pitch; and
   a width of the first branch is constant in one first branch.

7. The display device of claim 1, wherein:
   the first pixel electrode further comprises a connector connecting the first sub-electrode and the second sub-electrode.

8. The display device of claim 1, further comprising:
   a second pixel electrode adjacent to the first pixel electrode in a second direction crossing the first direction; and
   a second transistor electrically connected to the second pixel electrode,
   wherein:
   the gate line comprises a first sub-gate line and a second sub-gate line substantially parallel to each other;
   the first transistor is electrically connected to the first sub-gate line; and
   the second transistor is electrically connected to the second sub-gate line and the second data line.

9. The display device of claim 8, wherein the first data line and the second data line extend substantially in the second direction while crossing the first pixel electrode and the second pixel electrode.

10. The display device of claim 9, wherein:
    the first gap is disposed between the first data line and the second data line.

11. A display device comprising:
    a gate line;
    a first data line and a second data line adjacent to each other in a first direction and crossing the gate line;
    a first transistor electrically connected to the gate line and the first data line; and
    a first pixel electrode electrically connected to the first transistor,
    wherein:
    the first pixel electrode comprises a first sub-electrode and a second sub-electrode adjacent to each other in the first direction;
    the first sub-electrode comprises a first longitudinal stem extending in a direction substantially parallel to the first data line and overlapping the first data line, and a plurality of first branches connected to the first longitudinal stem;

the second sub-electrode comprises a second longitudinal stem extending in a direction substantially parallel to the second data line and overlapping the second data line, and a plurality of second branches connected to the second longitudinal stem; and the first sub-electrode comprises a first region where the first branches have a first pitch and a second region where the first branches have a second pitch less than the first pitch; and a width of the first branch is constant in one first branch.

12. The display device of claim 11, wherein a center of the first longitudinal stem is positioned at the first region.

13. The display device of claim 12, wherein:
the first sub-electrode further comprises a first transverse stem connected to the first longitudinal stem; and
a boundary between the first region and the second region crosses a portion of the first longitudinal stem positioned at one side of the first transverse stem.

14. The display device of claim 11, wherein:
a first gap extending in a second direction crossing the first direction is formed between the first sub-electrode and the second sub-electrode; and
a width of the first gap in the first direction is gradually changed along the second direction.

15. The display device of claim 14, wherein:
a width of at least a part of the first longitudinal stem in the first direction is gradually changed along the second direction; and
a direction in which the width of the first longitudinal stem in the first direction increases is opposite to a direction in which the width of the first gap in the first direction increases.

* * * * *